(12) United States Patent
Cumpston et al.

(10) Patent No.: US 8,106,292 B2
(45) Date of Patent: *Jan. 31, 2012

(54) VOLUME COMPENSATION WITHIN A PHOTOVOLTAIC DEVICE

(75) Inventors: Brian Cumpston, Pleasanton, CA (US); Tim Leong, Danville, CA (US)

(73) Assignee: Solyndra LLC, Fremont, CA (US)

(*) Notice: Subject to any disclaimer, the term of this patent is extended or adjusted under 35 U.S.C. 154(b) by 577 days.

This patent is subject to a terminal disclaimer.

(21) Appl. No.: 11/998,782

(22) Filed: Nov. 30, 2007

(65) Prior Publication Data

US 2008/0264473 A1 Oct. 30, 2008

Related U.S. Application Data

(60) Provisional application No. 60/926,837, filed on Apr. 30, 2007.

(51) Int. Cl.
*H02N 6/00* (2006.01)
*H01L 31/042* (2006.01)
*H01L 31/00* (2006.01)

(52) U.S. Cl. ........ 136/259; 136/252; 136/251; 136/260; 136/261; 136/262; 136/263; 136/264; 136/265

(58) Field of Classification Search .................. 136/246, 136/251, 259, 260–265
See application file for complete search history.

(56) References Cited

U.S. PATENT DOCUMENTS

| | | | | |
|---|---|---|---|---|
| 3,976,508 A | * | 8/1976 | Mlavsky | 136/246 |
| 3,990,914 A | | 11/1976 | Weinstein et al. | |
| 4,414,958 A | * | 11/1983 | Hozumi et al. | 126/708 |
| 4,913,744 A | | 4/1990 | Hoegl et al. | |
| 5,022,930 A | * | 6/1991 | Ackerman et al. | 136/251 |
| 5,437,736 A | | 8/1995 | Cole | |
| 5,902,416 A | | 5/1999 | Kern et al. | |
| 6,294,723 B2 | | 9/2001 | Uematsu et al. | |

(Continued)

FOREIGN PATENT DOCUMENTS

DE 32 09 548 3/1982
DE 43 39 547 A1 11/1993

(Continued)

OTHER PUBLICATIONS

International Search Report and Written Opinion dated Jan. 14, 2009 for International Application No. PCT/US2008/005536.

*Primary Examiner* — Basia Ridley
*Assistant Examiner* — Lindsey Bernier
(74) *Attorney, Agent, or Firm* — Morgan, Lewis & Bockius LLP; Brett Lovejoy

(57) ABSTRACT

Volume compensation in photovoltaic device is provided. The photovoltaic device has an outer transparent casing and a substrate that, together, define an inner volume. At least one solar cell is on the substrate. A filler layer seals the at least one solar cell within the inner volume. A container within the inner volume has an opening in fluid communication with the filler layer. A diaphragm is affixed to the opening thereby sealing the interior of the container from the filler layer. The diaphragm is configured to decrease the volume within the container when the filler layer thermally expands and to increase the volume within the container when the filler layer thermally contracts. In some instances, the substrate is hollowed and the container is formed within this hollow. The container can have multiple openings, each sealed with a diaphragm. There can be multiple containers within the photovoltaic device.

45 Claims, 11 Drawing Sheets

U.S. PATENT DOCUMENTS

| | | |
|---|---|---|
| 6,762,359 B2 | 7/2004 | Asai et al. |
| 6,936,761 B2 | 8/2005 | Pichler |
| 2005/0074915 A1* | 4/2005 | Tuttle et al. .................. 438/57 |
| 2005/0098202 A1 | 5/2005 | Maltby |

FOREIGN PATENT DOCUMENTS

| | | |
|---|---|---|
| DE | 44 06 760 A1 | 3/1994 |
| DE | 197 32 876 A | 7/1997 |
| FR | 2327643 A | 5/1977 |
| JP | 59125670 | 7/1984 |
| JP | 59 143377 | 8/1984 |
| WO | WO 84/04425 | 11/1984 |
| WO | WO 2005/071760 A1 | 8/2005 |
| WO | WO/2007/012026 A | 1/2007 |

* cited by examiner

VOLUME COMPENSATION WITHIN A PHOTOVOLTAIC DEVICE

CROSS REFERENCE TO RELATED APPLICATION

This application claims benefit, under 35 U.S.C. §119(e), of U.S. Provisional Patent Application No. 60/926,837, filed on Apr. 30, 2007, which is hereby incorporated by reference herein in its entirety.

BACKGROUND

FIG. 1 is a schematic block diagram of a conventional photovoltaic device. A photovoltaic device 10 can typically have one or more solar cells 12 disposed within it. A solar cell conventionally is made by having a semiconductor junction disposed between a layer of conducting material 104 and a layer of transparent conducting material 110. Light impinges upon the solar cells 12 of a photovoltaic module 10 and passes through the transparent conducting material layer 110. Although other designs are possible, a typical semiconductor junction comprises an absorber layer 106 and a window layer 108. Within the semiconductor junction, the photons interact with the material to produce electron-hole pairs. The semiconductor junction is typically doped creating an electric field extending from the junction layer. Accordingly, when the holes and/or electrons are created by the sunlight in the semiconductor junction, they will migrate depending on the polarity of the field either to the transparent conducting material layer 110 or the layer of conducting material 104. This migration creates current within the solar cell 12 that is routed out of the cell for storage and/or concurrent use.

One conducting node of the solar cell 12 is shown electrically coupled to an opposite node of another solar cell 12. In this manner, the current created in one solar cell may be transmitted to another, where it is eventually collected. The currently depicted apparatus in FIG. 1 is shown where the solar cells are coupled in series, thus creating a higher voltage device. In another manner, not shown, the solar cells can be coupled in parallel thereby increasing the resulting current rather than the voltage.

As further illustrated in FIG. 1, the conducting material 104 is supported by a substrate. Further, an antireflection coating 112 may be disposed on transparent conducting material 110. Solar cells 12 are sealed from the environment by the substrate 102 and the transparent panel 60. Typically, there is a filler layer 5 between the active layers of the solar cell and the transparent panel 60. In some solar cells, there is a filler layer between the conducting material 104 and the substrate 102. Typically, this filler layer is made of ethylene-vinyl acetate (EVA). The EVA is applied as a sheet then heated so that it melts and crosslinks. In this manner, an intermediate layer is formed between the device (layers 104 through 112) and the outer layers 60 and 102. The cured EVA is solid in nature, and has a very low volumetric coefficient of expansion relative to temperature. Accordingly, the EVA is very tolerant in the environment. However, it is hard to apply the EVA in anything other than planar sheets. Thus, for assemblies that are not planar in nature, the application of the EVA is problematic. Further, since the vast majority of solar cells are employed as planar cells, there really is no outstanding need to alter the outer-layer—EVA—device architecture.

Given the above background, what is needed in the art are improved filler layers for photovoltaic devices that can be easily assembled even in the case where the photovoltaic device is based upon a non-planar substrate. Further, what is needed in the art are photovoltaic devices that incorporate such improved filler layers.

BRIEF DESCRIPTION OF THE DRAWINGS

The accompanying drawings, which are incorporated into and constitute a part of this specification, illustrate one or more embodiments of the present disclosure and, together with the detailed description, serve to explain the principles and implementations of the disclosure.

Like reference numerals refer to corresponding parts throughout the several views of the drawings. Dimensions are not drawn to scale.

DETAILED DESCRIPTION

Figure 1:
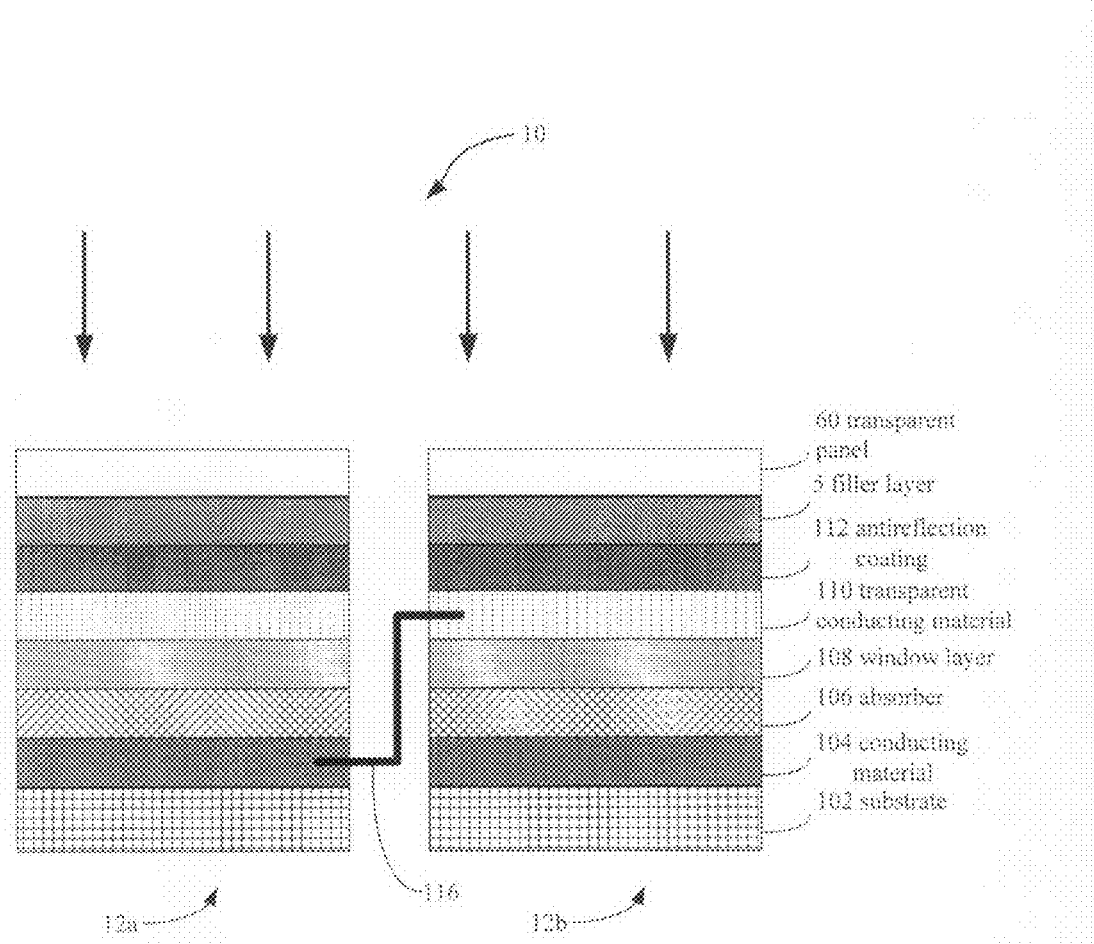
FIG. 1 illustrates interconnected solar cells in accordance with the prior art.

This application is directed to improved filler layers for photovoltaic devices that can be easily assembled even in the case where the photovoltaic device is based upon a non-planar substrate. Further, the application is directed to photovoltaic devices that incorporate such improved filler layers. Photovoltaic device construction methods are provided. In particular, methods for engineering photovoltaic devices that can withstand layers of material with substantially different thermal coefficients of expansion are provided.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure Referring to FIGS. 2 and 8, as used in this specification, a photovoltaic device 10 is a device that converts light energy to electric energy, and contains at least one solar cell 12. A photovoltaic device 10 may be described as an integral formation of one or a plurality of solar cells 12. In some instances, referring to FIG. 9, a plurality of solar cells 12 are coupled together electrically in an elongated structure in order to form the photovoltaic device. Examples of such photovoltaic architectures are found in U.S. Pat. No. 7,235,736, which is hereby incorporated by reference herein in its entirety. For instance, each solar cell 12 in an elongated photovoltaic device 10 may occupy a portion of an underlying substrate 102 common to the entire photovoltaic device 10 and the solar cells 12 may be monolithically integrated with each other so that they are electrically coupled to each other either in series or parallel. Alternatively, the elongated photovoltaic device 10 may have one single solar cell 12 that is disposed on a substrate. In some embodiments, a photovoltaic device 10 has 1, 2, 3, 4, 5 or more, 20 or more, or 100 or more such solar cells 12 integrated onto a common substrate 102. In general, a photovoltaic device 10 is made of a substrate 102 and a material, operable to convert light energy to electric energy, disposed on the substrate. In certain nonplanar embodiments, such material may circumferentially coat the underlying substrate. In some embodiments, such material constitutes the one or more solar cells 12 disposed on the substrate. The material typically comprises multiple layers such as a conducting material, a semiconductor junction, and a transparent conducting material.

1.1 Volume Compensation

Figure 2:
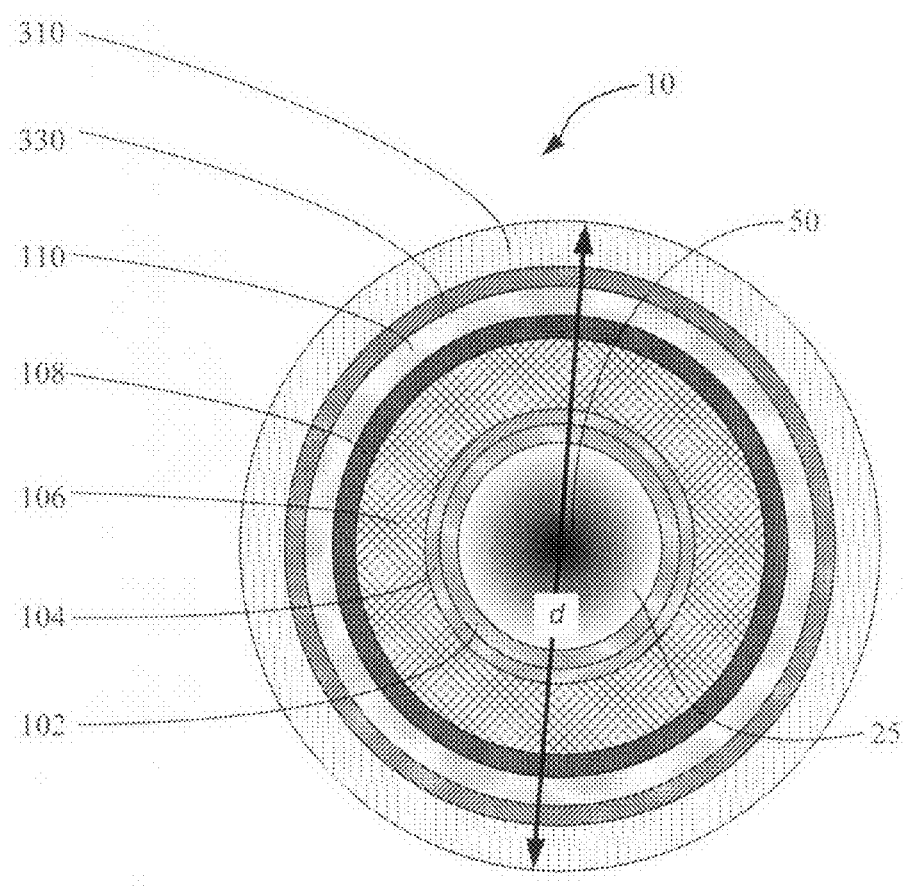
FIG. 2 is a cross-sectional illustration of the layers found in a nonplanar photovoltaic device having a diaphragm.
Figure 8A:
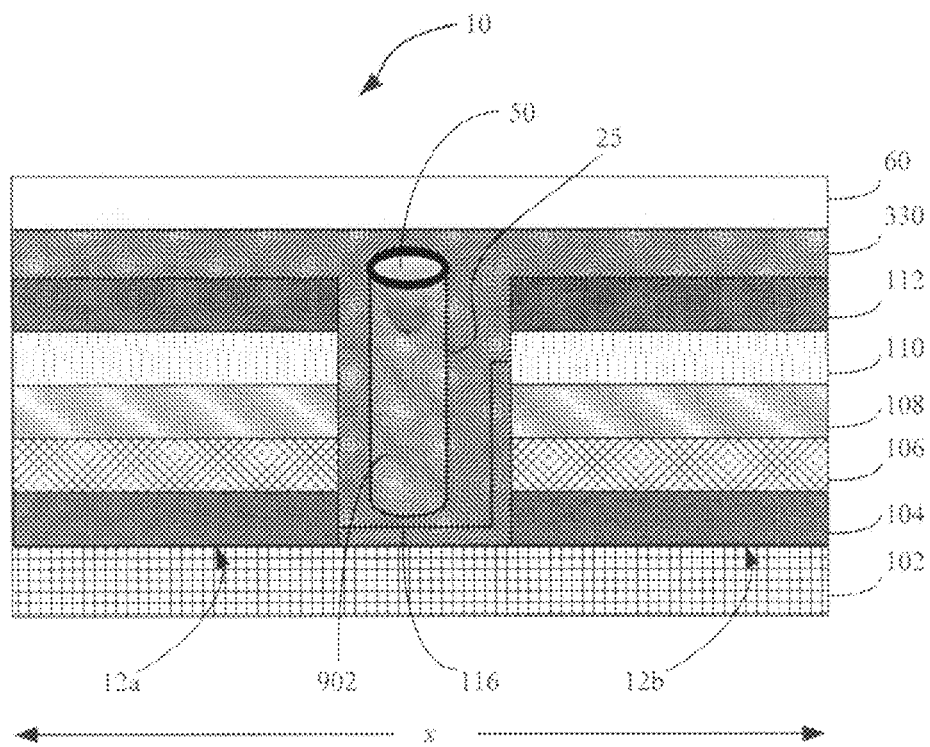
FIG. 8A illustrates a planar photovoltaic device with a volume compensation container.

Both planar photovoltaic devices 10, such as depicted in FIG. 8A, and photovoltaic devices 10 that are nonplanar, such as depicted in crosssection in FIG. 2, are encompassed in the present disclosure. In the photovoltaic device 10 of FIG. 2, a transparent casing 310 circumferentially covers underlying active layers. In some cases, the photovoltaic device 10 that is nonplanar is cylindrical or tubular as depicted in FIG. 2. As used herein, the term "cylindrical" means objects having a cylindrical or approximately cylindrical shape. In fact, cylindrical objects can have irregular shapes so long as the object, taken as a whole, is roughly cylindrical. Such cylindrical shapes can be solid (e.g., a rod) or hollowed (e.g., a tube). As used herein, the term "tubular" means objects having a tubular or approximately tubular shape. In fact, tubular objects can have irregular shapes so long as the object, taken as a whole, is roughly tubular.

FIG. 2 illustrates the cross-sectional view of an exemplary embodiment of a photovoltaic device 10 that is nonplanar. The photovoltaic device 10 has a substrate 102. In the nonplanar embodiments exemplified by FIG. 2, the substrate 102 has a hollow core that defines a container 25. In some embodiments, a flexible diaphragm 50 seals off one end of the hollow core of the substrate 102 while the other end of the hollow core is capped. In such embodiments, a container 25 is defined by the hollow core of the substrate 102, the flexible diaphragm 50 at one end of the hollow core, and the cap at the other end of the hollow core. In some embodiments, a flexible diaphragm 50 is used on each end of the hollow core of the substrate 102 to seal the hollow core. In such embodiments, the container 25 is defined by the hollow core of the substrate 102, the first flexible diaphragm 50 at one end of the hollow core, and the second flexible diaphragm 50 at other end of the hollow core. In some embodiments, the container 25 has little or no air pressure. In some embodiments, the container 25 is under a complete vacuum. In some embodiments, the container 25 is under less than 20 Torr, less than 40 Torr, less than 100 Torr, or less than 500 Torr of pressure. In some embodiments, the container is filled with an inert gas such as helium, neon, or argon.

The photovoltaic device 10 that is nonplanar can be characterized by a cross-section bounded by any one of a number of shapes other than the circular shaped depicted in FIG. 2. The bounding shape can be any one of circular, ovoid, or any shape characterized by one or more smooth curved surfaces, or any splice of smooth curved surfaces. The bounding shape can also be linear in nature, including triangular, rectangular, pentangular, hexagonal, or having any number of linear segmented surfaces. Or, the cross-section can be bounded by any combination of linear surfaces, arcuate surfaces, or curved surfaces. As described herein, for ease of discussion only, an omnifacial circular cross-section is illustrated to represent nonplanar embodiments of the photovoltaic device 10. However, it should be noted that any cross-sectional geometry may be used in a photovoltaic device 10 that is nonplanar in practice.

Referring to FIG. 2, a layer of conducting material 104, often referred to as the back electrode, is overlayed on all or a portion of the substrate 102. A semiconductor junction is overlayed on all or a portion of the conducting material 104. Although other designs are possible, a typical semiconductor junction comprises an absorber layer 106 and a window layer 108. Optionally, there is an intrinsic layer (i-layer) (not shown) overlayed on all or a portion of the semiconductor junction. A layer of transparent conducting material 110 overlays all or a portion of the semiconductor junction and/or i-layer. The conducting material 104, the semiconductor junction 106/108, and the transparent conducting material 110, with or without the intrinsic layer, collectively form a solar cell 12 that is disposed on the substrate 102. A filler layer 330 comprising a filler composition (sealant) overlays the solar cell 12 and seals the solar cell 12 within the inner volume defined by the substrate 102 and the transparent casing 310.

Advantageously, the current solar cell devices 10 employ a gel, resin, non-solid, or otherwise highly viscous matter for the filler composition of layer 330. In some embodiments, the filler composition is added to the assembly as a liquid, and allowed to cure to the gel or other viscous non-solid state. However, in this approach, the formed material has a much higher coefficient of expansion than conventional materials such as ethylene-vinyl acetate. Thus, during a typical thermal cycle, one can expect substantial volume changes in layer 330 relative to the use of conventional material for the layer 330 such as ethylene-vinyl acetate (EVA). For instance, EVA has a volumetric thermal coefficient of expansion of between 160 and $200 \times 10^{-6}/°$ C. whereas soda lime glass has a volumetric thermal coefficient of expansion of $8.6 \times 10^{-6}/°$ C. By contrast, the gels, resins, non-solids, or otherwise highly viscous matter used for the filler composition of layer 330 in the present disclosure have a volumetric thermal coefficient of expansion that is greater than $200 \times 10^{-6}/°$ C. For example, one material that is used for the layer 330 in the present disclosure, polydimethylsiloxane (PDMS), has a volumetric temperature coefficient of about $960 \times 10^{-6}/°$ C. Thus, in some embodiments, the layer 330 in the present disclosure has a volumetric thermal coefficient of expansion of greater than $250 \times 10^{-6}/°$ C., greater than $300 \times 10^{-6}/°$ C., greater than $400 \times 10^{-6}/°$ C., greater than $500 \times 10^{-6}/°$ C., greater than $1000 \times 10^{-6}/°$ C., greater than $2000 \times 10^{-6}/°$ C., greater than $5000 \times 10^{-6}/°$ C., or between $250 \times 10^{-6}/°$ C. and $10000 \times 10^{-6}/°$ C. In one particular embodiment, Dow Corning 200 fluid, which is composed of linear polydimethylsiloxane polymers and has a volumetric coefficient of expansion of $960 \times 10^{-6}/°$ C., is used for the filler composition of the filler layer 330.

Advantageously, volume compensation of the filler layer 330 layer is provided. In the case of the photovoltaic device 10 that is nonplanar, a diaphragm 50 seals off at least one end of the hollowed substrate 102 as illustrated in cross section in FIG. 2 and partial perspective view in FIGS. 3A-3D thereby forming a container 25 (FIG. 2 and FIGS. 3C and 3D) with a container volume. FIG. 3B illustrates a partial perspective view of the photovoltaic device that is nonplanar of FIG. 3A with a cutaway 70 to further illustrate diaphragm 50. FIG. 3C illustrates a partial perspective view of the photovoltaic device that is nonplanar of FIG. 3A with all but the hollow inner substrate core 102 and diaphragm 50 removed so that the details of diaphragm 50 and the container 25 are more readily apparent.

The diaphragm 50 is affixed to the end of the inner tube before the liquid laminate that forms the filter composition of the filler layer 330 is introduced into the assembly. The annular volume between the transparent casing 310 and the active device overlaying the substrate 102 is substantially filled with the substance thereby forming the "layer" 330, which can then cure to a more viscous state.

During a heating cycle, the filler composition forming the filler layer 330 expands. However, the force of expansion is offset by the diaphragm 50, which is forced inward into the container 25 due to the force as depicted in FIG. 3D. The resistance of the diaphragm is less than the resistance of the outer end cap (not shown) of the photovoltaic device 10 or the side walls of either the substrate 102 or the transparent casing 310. Thus, the force generated by the expanding volume is directed onto the diaphragm 50. When cooled, the pressure goes down within the filler layer 330 and the diaphragm 50 returns to the lower pressure position depicted in FIGS. 3A through 3C. Thus, FIG. 3 illustrates how a container 25 within an inner volume defined by the substrate 102 and outer the transparent casing 310 is formed. In particular, in FIG. 3, the container is found within the hollowed portion of substrate 102. The container 25 is defined by at least one wall (e.g., the interior wall of hollowed substrate 102) and an opening, where the opening is in fluid communication with the filler layer 330. A diaphragm 50 is affixed to the opening of the container 25. The diaphragm 50 seals the container 25 thereby defining a container volume. The diaphragm 50 is configured to increase the container volume when the filler layer 330 thermally contracts as illustrated in FIG. 3C. The diaphragm 50 is configured to decrease the container volume when the filler layer 330 thermally expands as illustrated in FIG. 3D.

In some embodiments, the diaphragm 50 is a made of rubber, a rubberlike material, a rubber derivative, silicone rubber, or an elastomer. In some embodiments, the diaphragm 50 is made of ethylene propylene diene monomer rubber. In some embodiments, the diaphragm 50 is made of natural rubber, vulcanized rubber, a butadiene-styrene polymer such as GR-S, neoprene, nitrile rubbers, butyl, polysulfide rubber, ethylene-propylene rubber, polyurethane rubber, silicone rubber, gutta-percha, and/or balata. In some embodiments the diaphragm 50 is made of silicone rubber. Silicone rubber is a rubberlike material having a tensile strength of between 400 lb/in$^2$ to 700 lb/in$^2$ (2.78 to $4.85 \times 106$ N/m$^2$) elongation. In some embodiments, the diaphragm 50 is made of SILASTIC® silicone rubber (Dow Corning). As used herein, the term "elastomer" is used to describe both natural and synthetic materials which are elastic or resilient and in general resemble natural rubber in feeling and appearance. See, for example, Avallone and Baumeister III, Marks' Standard Handbook for Mechanical Engineers, McGraw Hill, 1987, which is hereby incorporated by reference herein. In some embodiments, the diaphragm 50 is made out of a plastic or a rubber. In some embodiments, the diaphragm 50 is made out of high-density polyethylene, low-density polyethylene, polypropylene, cellulose acetate, vinyl, plasticized vinyl, cellulose acetate butyrate, melamine-formaldehyde, polyester, nylon. See, for example, Modern Plastics Encyclopedia, McGraw-Hill, which is hereby incorporated by reference herein for its teachings on the aforementioned compounds.

In general, the diaphragm 50 is designed with materials light in resiliency and volume contraction, that do not degrade the chemical components of the filler layer 330, and that can withstand stress and the operating temperature ranges of the solar photovoltaic device 10.

In nonplanar photovoltaic embodiments, a container 25 having a container volume is defined by the substrate 102 and the caps used to seal the substrate. In the embodiment illustrated in FIG. 2, one end of the substrate 102 is sealed by a diaphragm 50. The other end of the substrate 102 may also be sealed by a diaphragm 50 thereby defining the container volume. Alternatively, the other end of the substrate 102 may be sealed by a rigid cap, thereby defining the container volume. It is possible for this rigid cap to be an integral piece of the substrate 102. It is also possible for this rigid cap to be a separate piece that fits onto the end of the substrate 102 thereby sealing the interior volume of the substrate 102.

Advantageously, the diaphragm 50 is capable of expanding into the container volume defined by the substrate 102 when the photovoltaic device 10 warms during normal operation. This contraction reduces the sealed container volume defined by the interior of the substrate 102. In various embodiments, the diaphragm 50 is capable of reducing the container volume by up to 5 percent, up to 10 percent, up to 15 percent, up to 20 percent, up to 25 percent, up to 30 percent, up to 35 percent, or between 2 and 40 percent during operation of the photovoltaic device 10. For example, in one nonlimiting embodiment, when the photovoltaic device 10 is cold, the container volume of the container 25 is Y arbitrary volumetric units, but when the photovoltaic device 10 is heated during normal operation, the container volume is reduced to as little as 0.5Y arbitrary volumetric units, for a fifty percent reduction in volume, because the diaphragm 50 expands into the interior defined by the substrate 102.

Figure 4A:
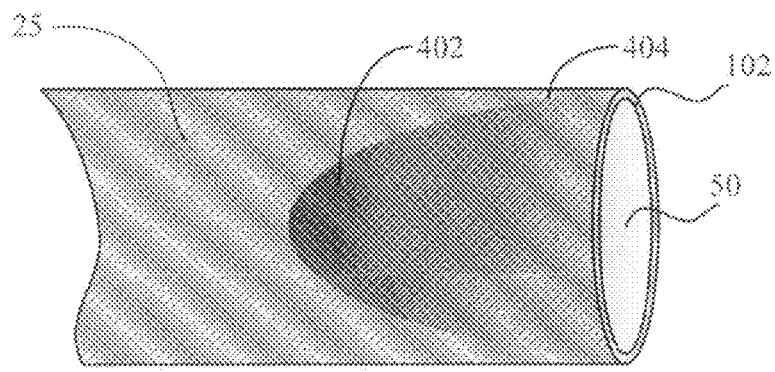
FIG. 4A illustrates a partial perspective view of a nonplanar photovoltaic device having a diaphragm that has a concave extension that fits into the hollow inner substrate core.

Referring to FIG. 4A, in one embodiment, the diaphragm 50 has a concave extension 402 that fits into the inner tube. Thus, in such embodiments, the diaphragm 50 has a diaphragm head 404 and a concave extension 402 that is referred to as a diaphragm tail.

Figure 5A:
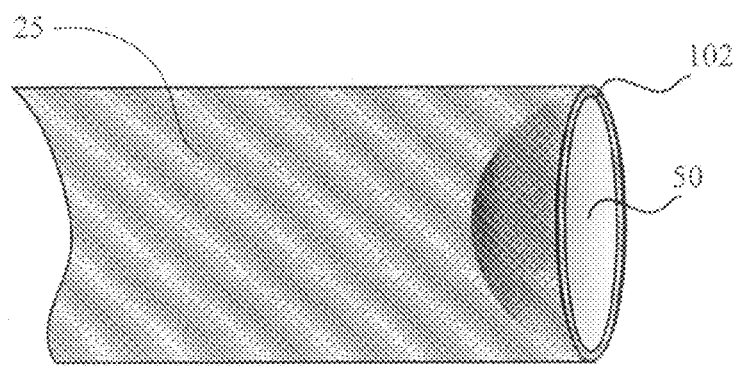
FIG. 5A illustrates a partial perspective view of a nonplanar photovoltaic device having a diaphragm constructed as a plug under low pressure.
Figure 5B:
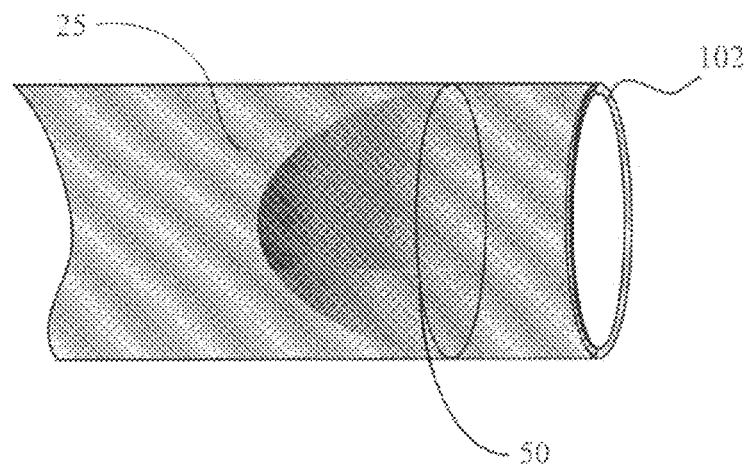
FIG. 5B illustrates a partial perspective view of the nonplanar photovoltaic device of FIG. 5B in which the diaphragm is under high pressure.

Referring to FIG. 5, in one embodiment, the diaphragm 50 is constructed as a plug and affixed through, for example, contact pressure. As illustrated in FIG. 5A, at low pressure, the diaphragm 50 is contracted. Thus, under low pressure, the diaphragm 50 is inserted into the volume defined by the core of the substrate 102 that is nonplanar. As the photovoltaic unit heats up during normal operation, the diaphragm 50 will tend to expand naturally due to the unequal pressures existing on either side of the diaphragm 50. Thus, for example, because of the unequal pressures on either side of the diaphragm 50, the diaphragm 50 will expand and adopt a position such as illustrated in FIG. 5B. Upon cooling, the diaphragm 50 will return to the position illustrated in FIG. 5A.

Figure 6A:
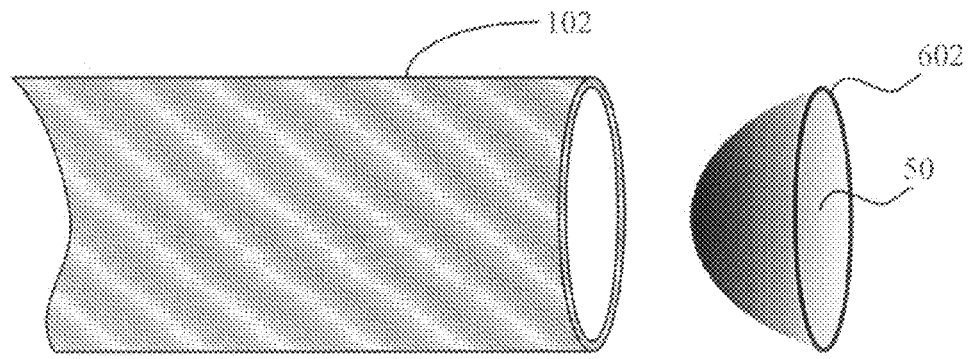
FIG. 6A illustrates a partial perspective view of a nonplanar photovoltaic device having a diaphragm with an expandable or resilient ring.
Figure 6B:
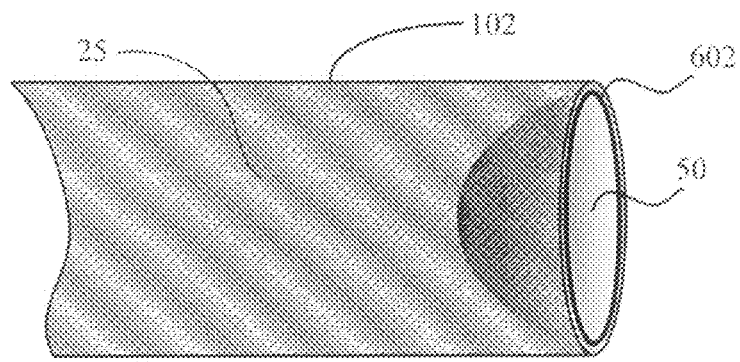
FIG. 6B illustrates a partial perspective view of the nonplanar photovoltaic device of FIG. 6A in which the diaphragm is inserted into the inner tube of the photovoltaic device under conditions of low pressure.
Figure 6C:
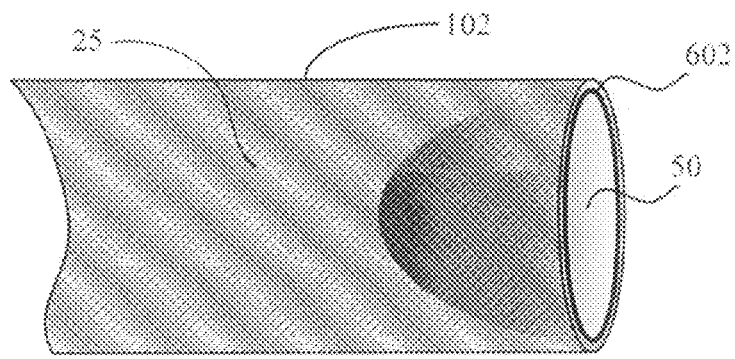
FIG. 6C illustrates a partial perspective view of the nonplanar photovoltaic device of FIG. 6A in which the diaphragm is inserted into the inner tube of the photovoltaic cell under conditions of high pressure.

Referring to FIG. 6, in one embodiment, the head of the diaphragm 50 has an expandable or resilient ring 602. Thus, as illustrated in FIG. 6B, when the diaphragm 50 is fitted into the opening of the substrate 102 that is nonplanar, the ring 602 compresses. When inside the tube, the ring 602 expands to create a force against the inner walls and edge of the opening of the interior of the substrate 102 that is nonplanar. As illustrated in FIG. 6C, when the filler layer 330 expands during normal operation of the photovoltaic device 10, it exerts a pressure on the diaphragm 50 causing the diaphragm 50 to expand into the interior of the substrate 102 that is nonplanar.

Figure 7A:
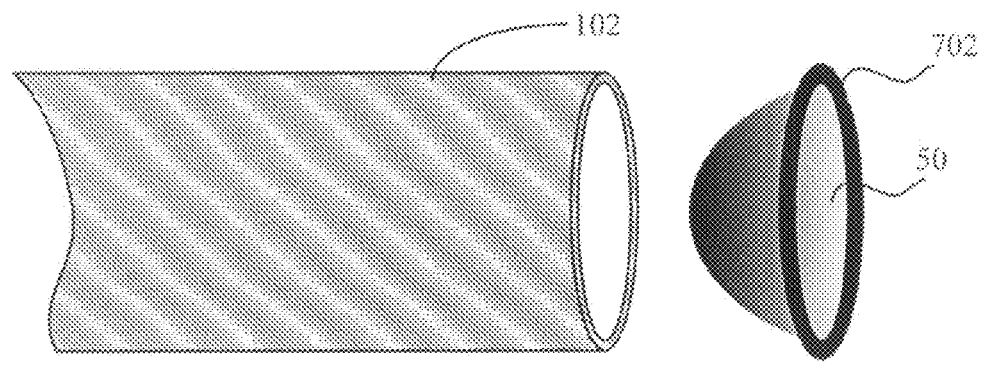
FIG. 7A illustrates a partial perspective view of a nonplanar photovoltaic device having a diaphragm with a lip.
Figure 7B:
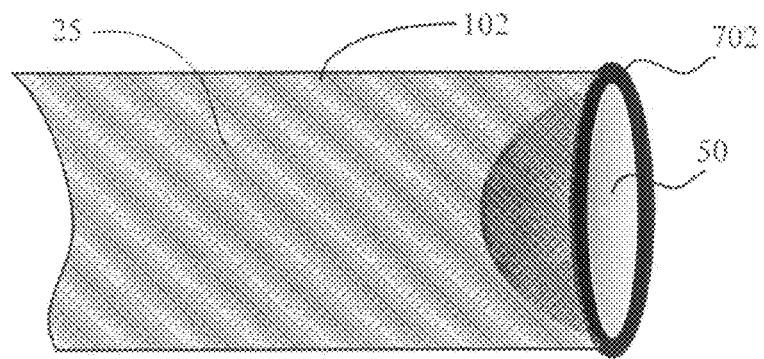
FIG. 7B illustrates a partial perspective view of the nonplanar photovoltaic device of FIG. 7A in which the diaphragm is pressed against the inner tube of the photovoltaic device under conditions of low pressure.
Figure 7C:
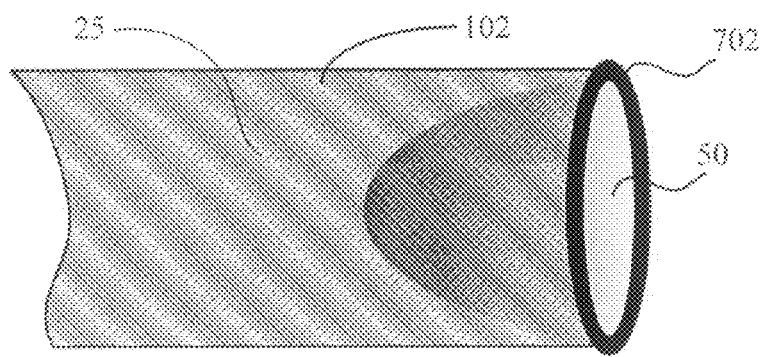
FIG. 7C illustrates a partial perspective view of the nonplanar photovoltaic device of FIG. 7A in which the diaphragm is pressed against the inner tube of the photovoltaic device under conditions of high pressure.

Referring to FIG. 7, in one embodiment, the diaphragm 50 has a lip 702 so that the diaphragm cannot be pressed completely into the interior of the substrate 102 that is nonplanar. Thus, as illustrated in FIG. 7B, when the diaphragm 50 is fitted into the opening of the nonplanar substrate 102, the lip 702 prevents the diaphragm 50 from being completely pressed into the interior of the nonplanar substrate 102. As illustrated in FIG. 7C, when filler layer 330 expands during normal operation of the photovoltaic device 10, it exerts a pressure on the diaphragm 50 causing the diaphragm to expand into the interior of the nonplanar substrate 102.

The above-described volume compensation apparatus can be used in the context of planar substrates 102 such as the one illustrated in FIG. 8A. In such embodiments, a bank of planar solar cells 12 can be constructed and a preformed container 25 can lie somewhere within the mass making up the active portion as illustrated in FIG. 8A. A closed off preformed container 25 having a volume 902 is formed in the cell bank. The preformed container 25 has one or more diaphragms 50 sealing openings to the container as depicted in FIG. 8A. The diaphragm 50 can be any or all of the diaphragms described above. In such embodiments, any of the above-identified materials for the filler layer 330 can be used for the filler layer 330 of FIG. 8A. Thus, in this way, volume compensation can be undertaken in a planar photovoltaic device. Although only a single preformed container 25 is shown in FIG. 8A, it will be appreciated that there can be any number of preformed containers 25 within embodiments of the photovoltaic apparatus 10 that are planar. For example, there can be one or more, two or more, three or more, ten or more, or 100 or more preformed containers 25 each having a container volume that is regulated by one or more diaphragms 50 in the manner described above. Each such preformed container 25 may have the same or different geometric shape. The cylindrical shape of the preformed container 25 in FIG. 8A is shown simply for the sake of presenting the concept. The cylindrical shape illustrated in FIG. 8A represents one of many different three dimensional geometric shapes that the preformed container 25 could adopt. Furthermore, the preformed container 25 may adopt an irregular nongeometric three dimensional shape.

Figure 8B:
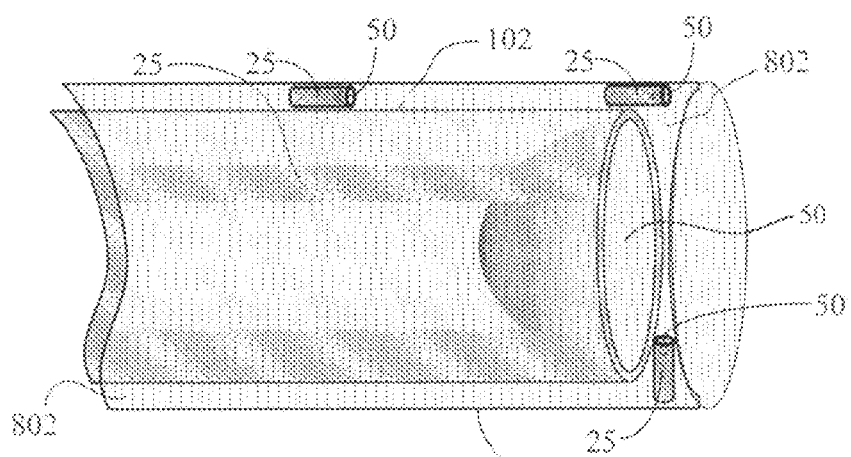
FIG. 8B illustrates a nonplanar photovoltaic device with a plurality of volume compensation containers.

It should also be mentioned that the preformed containers 25, such as those depicted in FIG. 8A, that are immersed within filler lay 330 can also be present in embodiments where the photovoltaic device 10 is nonplanar. For example, referring to FIG. 8B, in addition to or instead of a container 25 within substrate 102, one or more containers 25 may be immersed somewhere in the inner volume 802 defined by the substrate 102 and the transparent casing 310, other than the interior of the substrate 102, such as in the space between the solar cell 12 on the substrate 102 and the transparent casing 310 or at either or both ends of the photovoltaic device 10. As illustrated in FIG. 8, there can be multiple preformed containers 25 in the inner volume 802, even in embodiments where the photovoltaic device 10 is not planar.

1.2 Materials Used to Make Photovoltaic Layers

Volume compensation apparatus and techniques have now been described. Reference will now be made to exemplary materials and photovoltaic devices in which the volume compensation techniques can be used. Referring to FIG. 2, reference will now be made to each of the exemplary layers in the photovoltaic device 10.

Substrate 102. The substrate 102 serves as a substrate for the photovoltaic device 10. In some embodiments, the substrate 102 is made of a plastic, metal, metal alloy, or glass. In some embodiments, the substrate 102 has a nonplanar shape. In some embodiments, the substrate 102 has a cylindrical shape. In some embodiments, the substrate 102 has a hollow core. In some embodiments, the shape of the substrate 102 is only approximately that of a cylindrical object, meaning that a cross-section taken at a right angle to the long axis of substrate 102 defines an ellipse rather than a circle. As the term is used herein, such approximately shaped objects are still considered cylindrically shaped in the present disclosure.

In some embodiments, the substrate 102 is made of a urethane polymer, an acrylic polymer, a fluoropolymer, polybenzamidazole, polyimide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadienestyrene, polytetrafluoro-ethylene, polymethacrylate, nylon 6,6, cellulose acetate butyrate, cellulose acetate, rigid vinyl, plasticized vinyl, or polypropylene. In some embodiments, the substrate 102 is made of aluminosilicate glass, borosificate glass (e.g., Pyrex, Duran, Simax, etc.), dichroic glass, germanium/semiconductor glass, glass ceramic, silicate/fused silica glass, soda lime glass, quartz glass, chalcogenide/sulphide glass, fluoride glass, pyrex glass, a glass-based phenolic, cereated glass, or flint glass. In some embodiments, the substrate 102 is a solid cylindrical shape. Such solid cylindrical substrates 102 can be made out of a plastic, glass, metal, or metal alloy.

In some embodiments, the substrate 102 is an electrically conductive nonmetallic material. In some embodiments, the substrate 102 is tubing (e.g., plastic or glass tubing). In some embodiments, the substrate 102 is made of a material such as polybenzamidazole (e.g., CELAZOLE®, available from Boedeker Plastics, Inc., Shiner, Tex.). In some embodiments, the substrate 102 is made of polymide (e.g., DuPont™ VESPEL®, or DuPont™ KAPTON®, Wilmington, Del.). In some embodiments, the substrate 102 is made of polytetrafluoroethylene (PTFE) or polyetheretherketone (PEEK), each of which is available from Boedeker Plastics, Inc. In some embodiments, the substrate 102 is made of polyamide-imide (e.g., TORLON® PAI, Solvay Advanced Polymers, Alpharetta, Ga.).

In some embodiments, the substrate 102 is made of a glass-based phenolic. Phenolic laminates are made by applying heat and pressure to layers of paper, canvas, linen or glass cloth impregnated with synthetic thermosetting resins. When heat and pressure are applied to the layers, a chemical reaction (polymerization) transforms the separate layers into a single laminated material with a "set" shape that cannot be softened again. Therefore, these materials are called "thermosets." A variety of resin types and cloth materials can be used to manufacture thermoset laminates with a range of mechanical, thermal, and electrical properties. In some embodiments, the substrate 102 is a phenoloic laminate having a NEMA grade of G-3, G-5, G-7, G-9, G-10 or G-11. Exemplary phenolic laminates are available from Boedeker Plastics, Inc.

In some embodiments, the substrate 102 is made of polystyrene. Examples of polystyrene include general purpose polystyrene and high impact polystyrene as detailed in Marks' *Standard Handbook for Mechanical Engineers*, ninth edition, 1987, McGraw-Hill, Inc., p. 6-174, which is hereby incorporated by reference herein in its entirety. In still other embodiments, the substrate 102 is made of cross-linked polystyrene. One example of cross-linked polystyrene is REXO-LITE® (C-Lec Plastics, Inc). Rexolite is a thermoset, in particular, a rigid and translucent plastic produced by cross linking polystyrene with divinylbenzene.

In some embodiments, the substrate 102 is a polyester wire (e.g., a MYLAR® wire). MYLAR® is available from DuPont Teijin Films (Wilmington, Del.). In still other embodiments, the substrate 102 is made of DURASONE®, which is made by using polyester, vinylester, epoxid and modified epoxy resins combined with glass fibers (Roechling Engineering Plastic Pte Ltd., Singapore).

In still other embodiments, the substrate 102 is made of polycarbonate. Such polycarbonates can have varying amounts of glass fibers (e.g., 10%, 20%, 30%, or 40%) in order to adjust tensile strength, stiffness, compressive strength, as well as the thermal expansion coefficient of the material. Exemplary polycarbonates are ZELUX® M and ZELUX® W, which are available from Boedeker Plastics, Inc.

In some embodiments, the substrate 102 is made of polyethylene. In some embodiments, the substrate 102 is made of low density polyethylene (LDPE), high density polyethylene (HDPE), or ultra high molecular weight polyethylene (UHMW PE). Chemical properties of HDPE are described in Marks' *Standard Handbook for Mechanical Engineers*, ninth edition, 1987, McGraw-Hill, Inc., p. 6-173, which is hereby incorporated by reference herein in its entirety. In some embodiments, the substrate 102 is made of acrylonitrile-butadiene-styrene, polytetrfluoro-ethylene (Teflon), polymethacrylate (lucite or plexiglass), nylon 6,6, cellulose acetate butyrate, cellulose acetate, rigid vinyl, plasticized vinyl, or polypropylene. Chemical properties of these materials are described in Marks' *Standard Handbook for Mechanical Engineers*, ninth edition, 1987, McGraw-Hill, Inc., pp. 6-172 through 1-175, which is hereby incorporated by reference herein in its entirety.

Additional exemplary materials that can be used to form the substrate 102 are found in *Modern Plastics Encyclopedia*, McGraw-Hill; Reinhold Plastics Applications Series, Reinhold Roff, *Fibres, Plastics and Rubbers*, Butterworth; Lee and Neville, *Epoxy Resins*, McGraw-Hill; Bilmetyer, *Textbook of Polymer Science*, Interscience; Schmidt and Marlies, *Principles of high polymer theory and practice*, McGraw-Hill; Beadle (ed.), Plastics, Morgan-Grampiand, Ltd., 2 vols. 1970; Tobolsky and Mark (eds.), *Polymer Science and Materials*, Wiley, 1971; Glanville, *The Plastics's Engineer's Data Book*, Industrial Press, 1971; Mohr (editor and senior author), Oleesky, Shook, and Meyers, *SPI Handbook of Technology and Engineering of Reinforced Plastics Composites*, Van Nostrand Reinhold, 1973, each of which is hereby incorporated by reference herein in its entirety.

Conducting material 104. In FIGS. 1 and 2, conducting material 104 is depicted as a layer disposed on an underlying substrate 102. In some embodiments, the conducting material 104 is a thin layer disposed on substrate 102. In other embodiments, the conducting material 104 and the substrate 102 are, in fact, one and the same. In such embodiments, the substrate 102 is made of a conducting material and there is no layer of conducting material 104 overlayed on the substrate 102. In such embodiments, the substrate is made of any of the materials that can be used to form the conducting material layer 104 in the embodiments that have a conducting material layer 104.

Conducting material 104 is disposed on the substrate 102. The conducting material 104 serves as the first electrode in the assembly. In general, the conducting material 104 is made out of any material such that it can support the photovoltaic current generated by the photovoltaic device with negligible resistive losses. In some embodiments, conducting material 104 is composed of any conductive material, such as aluminum, molybdenum, tungsten, vanadium, rhodium, niobium, chromium, tantalum, titanium, steel, nickel, platinum, silver, gold, an alloy thereof, or any combination thereof. In some embodiments, conducting material 104 is composed of any conductive material, such as indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic. As defined herein, a conductive plastic is one that, through compounding techniques, contains conductive fillers which, in turn, impart their conductive properties to the plastic. In some embodiments, the conductive plastics that may be used to form conducting material 104 contain fillers that form sufficient conductive current-carrying paths through the plastic matrix to support the photovoltaic current generated by the photovoltaic device with negligible resistive losses. The plastic matrix of the conductive plastic is typically insulating, but the composite produced exhibits the conductive properties of the filler. In some embodiments, this conductive plastic is inherently conductive without any requirement for a filler.

Semiconductor junction 106/108. A semiconductor junction 106/108 is formed on the conducting material 104. Semiconductor junction 106/108 is any photovoltaic homojunction, heterojunction, heteroface junction, buried homojunction, a p-i-n junction or a tandem junction having an absorber layer that is a direct band-gap absorber (e.g., crystalline silicon) or an indirect band-gap absorber (e.g., amorphous silicon). Such junctions are described in Chapter 1 of Bube, *Photovoltaic Materials,* 1998, Imperial College Press, London, as well as Lugue and Hegedus, 2003, *Handbook of Photovoltaic Science and Engineering,* John Wiley & Sons, Ltd., West Sussex, England, each of which is hereby incorporated by reference herein in its entirety. As such, it is entirely possible for the semiconductor junction 106/108 to have more than just two layers (e.g., layers other than or in addition to an absorber 106 and window layer 108). Details of exemplary types of semiconductors junctions 106/108 in accordance with the present disclosure are disclosed in below. In addition to the exemplary junctions disclosed below, the junctions 106/108 can be multijunctions in which light traverses into the core of the junction 106/108 through multiple junctions that, preferably, have successfully smaller band gaps. In some embodiments, the semiconductor junction 106/108 includes a copper-indium-gallium-diselenide (CIGS) absorber layer.

In some embodiments where a nonplanar substrate 102 is used, the semiconductor junction 106/108 comprises an inner layer and an outer layer where the outer layer comprises a first conductivity type and the inner layer comprises a second, opposite, conductivity type. In an exemplary embodiment, the inner coaxial layer comprises copper-indium-gallium-diselenide (CIGS) whereas the outer coaxial layer comprises $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$, or doped ZnO.

Optional intrinsic layer. Optionally, there is a thin intrinsic layer (i-layer) 415 overlayed on semiconductor junction 106/108. The i-layer can be formed using any undoped transparent oxide including, but not limited to, zinc oxide, metal oxide, or any transparent material that is highly insulating. In some embodiments, the i-layer is highly pure zinc oxide.

Transparent conductive layer 110. The transparent conductive layer 110 is disposed on all or a portion of the semiconductor junction 106/108 thereby completing the active solar cell circuit. As noted above, in some embodiments, a thin i-layer is disposed on the semiconductor junction 106/108. In such embodiments, the transparent conductive layer 110 is disposed on the i-layer. In some embodiments, the transparent conductive layer 110 is made of tin oxide $SnO_x$ (with or without fluorine doping), indium-tin oxide (ITO), doped zinc oxide (e.g., aluminum doped zinc oxide, gallium doped zinc oxide, boron dope zinc oxide), indium-zinc oxide or any combination thereof. In some embodiments, the transparent conductive layer 110 is either p-doped or n-doped. In some embodiments, the transparent conductive layer 110 is made of carbon nanotubes. Carbon nanotubes are commercially available, for example, from Eikos (Franklin, Mass.) and are described in U.S. Pat. No. 6,988,925, which is hereby incorporated by reference herein in its entirety. For example, in embodiments where the outer semiconductor layer of the junction 106/108 is p-doped, the transparent conductive layer 110 can be p-doped. Likewise, in embodiments where the outer semiconductor layer of semiconductor junction 106/108 is n-doped, the transparent conductive layer 110 can be n-doped. In general, the transparent conductive layer 110 is preferably made of a material that has very low resistance, suitable optical transmission properties (e.g., greater than 90%), and a deposition temperature that will not damage underlying layers of the semiconductor junction 106/108 and/or the optional i-layer. In some embodiments, the transparent conductive layer 110 is an electrically conductive polymer material such as a conductive polytiophene, a conductive polyaniline, a conductive polypyrrole, a PSS-doped PEDOT (e.g., BAYRTON), or a derivative of any of the foregoing. In some embodiments, the transparent conductive layer 110 comprises more than one layer, including a first layer comprising tin oxide $SnO_x$ (with or without fluorine doping), indium-tin oxide (ITO), indium-zinc oxide, doped zinc oxide (e.g., aluminum doped zinc oxide, gallium doped zinc oxide, boron dope zinc oxide) or a combination thereof and a second layer comprising a conductive polytiophene, a conductive polyaniline, a conductive polypyrrole, a PSS-doped PEDOT (e.g., BAYRTON), or a derivative of any of the foregoing. Additional suitable materials that can be used to form the transparent conductive layer 110 are disclosed in United States Patent publication 2004/0187917A1 to Pichler, which is hereby incorporated by reference herein in its entirety.

Optional electrode strips. In some embodiments in accordance with the present disclosure, counter-electrode strips or leads are disposed on the transparent conductive layer 110 in order to facilitate electrical current flow. In some embodiments, optional electrode strips are positioned at spaced intervals on the surface of the transparent conductive layer 110. For instance, the electrode strips can run parallel to each other and be spaced out at ninety degree intervals along the long axis of a nonplanar solar cell device 10. In some embodiments of nonplanar solar cell devices 10, with reference to the cross-section taken through the long axis of the devices, electrode strips are spaced out at up to five degree, up to ten degree, up to fifteen degree, up to twenty degree, up to thirty degree, up to forty degree, up to fifty degree, up to sixty degree, up to ninety degree or up to 180 degree intervals on the surface of the transparent conductive layer 110. In some embodiments, there is a single electrode strip on the surface of the transparent conductive layer 110. In many embodiments, there is no electrode strip on the surface of the transparent conductive layer 110. In some embodiments, there is two, three, four, five, six, seven, eight, nine, ten, eleven, twelve, fifteen or more, or thirty or more electrode strips on the transparent conductive layer 110, all running parallel, or near parallel, to each down the long axis of the photovoltaic device 10. In some embodiments wherein the photovoltaic device 10 is cylindrical, electrode strips are evenly spaced about the circumference of the transparent conductive layer 110. In alternative embodiments, electrode strips are not evenly spaced about the circumference of the transparent conductive layer 110. In some embodiments, the electrode strips are only on one face of the photovoltaic device 10. In some embodiments, the electrode strips are made of conductive epoxy, conductive ink, copper or an alloy thereof, aluminum or an alloy thereof, nickel or an alloy thereof, silver or an alloy thereof, gold or an alloy thereof, a conductive glue, or a conductive plastic.

In some embodiments, the electrode strips are interconnected to each other by grid lines. These grid lines can be thicker than, thinner than, or the same thickness as the electrode strips. These grid lines can be made of the same or different electrically material as the electrode strips.

In some embodiments, the electrode strips are deposited on the transparent conductive layer using ink jet printing. Examples of conductive ink that can be used for such strips include, but are not limited to silver loaded or nickel loaded conductive ink. In some embodiments, epoxies as well as anisotropic conductive adhesives can be used to construct electrode strips. In typical embodiments, such inks or epoxies are thermally cured in order to form the electrode strips.

Filler layer 330. Advantageously, the current solar cell devices 10 employ a gel, resin, non-solid, or otherwise highly viscous filler composition for the layer 330. The material is added to the assembly as a liquid, and allowed to cure to the gel or other viscous non-solid state. However, in this approach, the formed material has a much higher coefficient of expansion than conventional materials such as ethylene-vinyl acetate. Thus, during a typical thermal cycle, one can expect substantial volume changes in layer 330 relative to the use of conventional material for layer 330 such as EVA. In some embodiments, the filler composition has a low viscosity.

In one example, a medium viscosity polydimethylsiloxane mixed with an elastomer-type dielectric gel can be used to make the filler composition of the filler layer 330. In one case, as an example, a mixture of 85% (by weight) Dow Corning 200 fluid, 50 centistroke viscosity (PDMS, polydimethylsiloxane); 7.5% Dow Corning 3-4207 Dielectric Tough Gel, Part A—Resin 7.5% Dow Corning 3-4207 Dielectric Tough Gel, Part B—Pt Catalyst, is used to make the filler layer 330. Of course, other oils, gels, or silicones can be used for the filler layer 330, and accordingly this specification should be read to include those other oils, gels and silicones to generate the described layer for the filler layer 330. Such oils include silicon based oils, and the gels include many commercially available dielectric gels, to name a few. Curing of silicones can also extend beyond a gel like state. Of course, commercially available dielectric gels and silicones and the various formulations are contemplated as being usable in this application.

In some embodiments, a silicone-based dielectric gel can be used in situ. Or, as indicated above, the dielectric gel can be mixed with a silicone based oil to reduce both beginning and ending viscosities. The ratio of silicone oil by weight in the mixture can be varied. As mentioned before, the ratio of silicone oil by weight in the mixture of silicone-based oil and silicone-based dielectric gel in the specific example above is 85%. However, ratios at or about (e.g. ±2%) 25%, 30%, 35%, 40%, 45%, 50%, 55%, 60%, 65%, 70%, 75%, and 85% are all contemplated. Ranges of 20%-30%, 25%-35%, 30%-40%, 35%-45%, 40%-50%, 45%-55%, 50%-60%, 55%-65%, 60%-70%, 65%-75%, 70%-80%, 75%-85%, and 80%-90% (by weight) are also contemplated. Further, these same ratios by weight can be contemplated for the mixture when using other types of oils or acrylates to lessen the beginning viscosity of the gel mixture alone.

Transparent casing 310. The transparent casing 310 seals the photovoltaic device as illustrated in FIG. 2. In some embodiments the transparent casing 310 is made of plastic or glass. In some embodiments, the transparent casing 310 is made of a urethane polymer, an acrylic polymer, polymethylmethacrylate (PMMA), a fluoropolymer, silicone, polydimethyl siloxane (PDMS), silicone gel, epoxy, ethyl vinyl acetate (EVA), perfluoroalkoxy fluorocarbon (PFA), nylon/polyamide, cross-linked polyethylene (PEX), polyolefin, polypropylene (PP), polyethylene terephtalate glycol (PETG), polytetrafluoroethylene (PTFE), thermoplastic copolymer (for example, ETFE® which is a derived from the polymerization of ethylene and tetrafluoroethylene: TEFLON® monomers), polyurethane/urethane, polyvinyl chloride (PVC), polyvinylidene fluoride (PVDF), TYGON®, vinyl, VITON®, or any combination or variation thereof.

In some embodiments, the transparent casing 310 comprises a plurality of transparent casing layers. In some embodiments, each transparent casing layer is composed of a different material. For example, in some embodiments, the transparent casing 310 comprises a first transparent casing layer and a second transparent casing layer. Depending on the exact configuration of the photovoltaic device 10, the first transparent casing layer is disposed on the transparent conductive layer 110, optional filler layer 330 or a water resistance layer. The second transparent casing layer is then disposed on the first transparent casing layer.

In some embodiments, each transparent casing layer has different properties. In one example, the outer transparent casing layer has excellent UV shielding properties whereas the inner transparent casing layer has good water proofing characteristics. Moreover, the use of multiple transparent casing layers can be used to reduce costs and/or improve the overall properties of the transparent casing 310. For example, one transparent casing layer may be made of an expensive material that has a desired physical property. By using one or more additional transparent casing layers, the thickness of the expensive transparent casing layer may be reduced, thereby achieving a savings in material costs. In another example, one transparent casing layer may have excellent optical properties (e.g., index of refraction, etc.) but be very heavy. By using one or more additional transparent casing layers, the thickness of the heavy transparent casing layer may be reduced, thereby reducing the overall weight of transparent casing 310.

In some embodiments, the transparent casing 310 is made of glass. Any of a wide variety of glasses can be used to make the transparent casing 310, some of which are described here. In some embodiments, the transparent casing 310 is made of silicon dioxide ($SiO_2$) glass In some embodiments, the transparent casing 310 is made of soda lime glass formed from silicon dioxide, soda (e.g., sodium carbonate $Na_2CO_3$), or potash, a potassium compound, and lime (calcium oxide, CaO). In some embodiments, the transparent casing 310 is made of lead glass, such as lead crystal or flint glass. In some embodiments, silicon dioxide glass doped with boron, barium, thorium oxide, lanthanum oxide, iron, or cerium(IV) oxide is used to make transparent casing 310. In some embodiments, transparent casing 310 is made of aluminosilicate, borosilicate (e.g., PYREX®, DURAN®, SIMAX®), dichroic, germanium/semiconductor, glass ceramic, silicate/fused silica, soda lime, quartz, chalcogenide/sulphide, or cereated glass.

In some embodiments, the transparent casing 310 is made of clear plastic such as ethyl vinyl acetate (EVA), perfluoroalkoxy fluorocarbon (PFA), nylon/polyamide, cross-linked polyethylene (PEX), polyolefin, polypropylene (PP), polyethylene terephtalate glycol (PETG), polytetrafluoroethylene (PTFE), thermoplastic copolymer (for example, ETFE®), polyurethane/urethane, polyvinyl chloride (PVC), polyvinylidene fluoride (PVDF), TYGON®, vinyl, or VITON®.

Optional water resistant layer. In some embodiments, one or more layers of water resistant layer are coated over the photovoltaic device 10 to prevent the damaging effects of water. In some embodiments, this water resistant layer is coated onto the transparent conductive layer 110 prior to depositing the filler layer 330 and encasing the photovoltaic device 10 in the transparent casing 310. In some embodiments, such water resistant layers are circumferentially coated onto the transparent casing 310 itself. The optical properties of the water resistant layer are chosen so that they do not interfere with the absorption of incident solar radiation by the photovoltaic device 10. In some embodiments, this water resistant layer is made of clear silicone, SiN, $SiO_xN_y$, $SiO_x$, or $Al_2O_3$, where x and y are integers. In some embodiments, the optional water resistant layer is made of a Q-type silicone, a silsequioxane, a D-type silicon, or an M-type silicon.

Optional antireflective coating. In some embodiments, an optional antireflective coating is also disposed on the photovoltaic device 10 (e.g., on the transparent casing 310) to maximize solar cell efficiency. In some embodiments, there is a both a water resistant layer and an antireflective coating deposited on the transparent casing 310. In some embodiments, a single layer serves the dual purpose of a water resistant layer and an anti-reflective coating. In some embodiments, the antireflective coating is made of $MgF_2$, silicone nitrate, titanium nitrate, silicon monoxide (SiO), or silicon oxide nitrite. In some embodiments, there is more than one layer of antireflective coating. In some embodiments, there is more than one layer of antireflective coating and each layer is made of the same material. In some embodiments, there is more than one layer of antireflective coating and each layer is made of a different material.

In some embodiments, some of the layers of multi-layered photovoltaic devices 10 are constructed using cylindrical magnetron sputtering techniques. In some embodiments, some of the layers of multi-layered photovoltaic devices 10 are constructed using conventional sputtering methods or reactive sputtering methods on long tubes or strips. Sputtering coating methods for nonplanar substrates 102 such as long tubes and strips are disclosed in for example, Hoshi et al., 1983, "Thin Film Coating Techniques on Wires and Inner Walls of Small Tubes via Cylindrical Magnetron Sputtering," *Electrical Engineering in Japan* 103:73-80; Lincoln and Blickensderfer, 1980, "Adapting Conventional Sputtering Equipment for Coating Long Tubes and Strips," *J. Vac. Sci. Technol.* 17:1252-1253; Harding, 1977, "Improvements in a dc Reactive Sputtering System for Coating Tubes," *J. Vac. Sci. Technol.* 14:1313-1315; Pearce, 1970, "A Thick Film Vacuum Deposition System for Microwave Tube Component Coating," Conference Records of 1970 *Conference on Electron Device Techniques* 208-211; and Harding et al., 1979, "Production of Properties of Selective Surfaces Coated onto Glass Tubes by a Magnetron Sputtering System," *Proceedings of the International Solar Energy Society* 1912-1916, each of which is hereby incorporated by reference herein in its entirety.

Optional fluorescent material. In some embodiments, a fluorescent material (e.g., luminescent material, phosphorescent material) is coated on a surface of a layer of the photovoltaic device 10. In some embodiments, the fluorescent material is coated on the luminal surface and/or the exterior surface of the transparent casing 310. In some embodiments, the fluorescent material is coated on the outside surface of the transparent conducting material 110. In some embodiments, the photovoltaic device includes a water resistant layer and the fluorescent material is coated on the water resistant layer. In some embodiments, more than one surface of the photovoltaic device 10 is coated with optional fluorescent material. In some embodiments, the fluorescent material absorbs blue and/or ultraviolet light, which some semiconductor junctions 106/108 do not use to convert to electricity, and the fluorescent material emits light in visible and/or infrared light which is useful for electrical generation in some semiconductor junctions 106/108.

Fluorescent, luminescent, or phosphorescent materials can absorb light in the blue or UV range and emit visible light. Phosphorescent materials, or phosphors, usually comprise a suitable host material and an activator material. The host materials are typically oxides, sulfides, selenides, halides or silicates of zinc, cadmium, manganese, aluminum, silicon, or various rare earth metals. The activators are added to prolong the emission time.

In some embodiments, phosphorescent materials are incorporated in the systems and methods of the present disclosure to enhance light absorption by the photovoltaic device 10. In some embodiments, the phosphorescent material is directly added to the material used to make the transparent casing 310. In some embodiments, the phosphorescent materials are mixed with a binder for use as transparent paints to coat various outer or inner layers of the photovoltaic device 10, as described above.

Exemplary phosphors include, but are not limited to, copper-activated zinc sulfide (ZnS:Cu) and silver-activated zinc sulfide (ZnS:Ag). Other exemplary phosphorescent materials include, but are not limited to, zinc sulfide and cadmium sulfide (ZnS:CdS), strontium aluminate activated by europium ($SrAlO_3$:Eu), strontium titanium activated by praseodymium and aluminum (SrTiO3:Pr, Al), calcium sulfide with strontium sulfide with bismuth ((Ca,Sr)S:Bi), copper and magnesium activated zinc sulfide (ZnS:Cu,Mg), or any combination thereof.

Methods for creating phosphor materials are known in the art. For example, methods of making ZnS:Cu or other related phosphorescent materials are described in U.S. Pat. No. 2,807,587 to Butler et al.; U.S. Pat. No. 3,031,415 to Morrison et al.; U.S. Pat. No. 3,031,416 to Morrison et al.; U.S. Pat. No. 3,152,995 to Strock; U.S. Pat. No. 3,154,712 to Payne; U.S. Pat. No. 3,222,214 to Lagos et al.; U.S. Pat. No. 3,657,142 to Poss; U.S. Pat. No. 4,859,361 to Reilly et al., and U.S. Pat. No. 5,269,966 to Karam et al., each of which is hereby incorporated by reference herein in its entirety. Methods for making ZnS:Ag or related phosphorescent materials are described in U.S. Pat. No. 6,200,497 to Park et al., U.S. Pat. No. 6,025,675 to Ihara et al.; U.S. Pat. No. 4,804,882 to Takahara et al., and U.S. Pat. No. 4,512,912 to Matsuda et al., each of which is hereby incorporated by reference herein in its entirety. Generally, the persistence of the phosphor increases as the wavelength decreases. In some embodiments, quantum dots of CdSe or similar phosphorescent material can be used to get the same effects. See Dabbousi et al., 1995, "Electroluminescence from CdSe quantum-dot/polymer composites," Applied Physics Letters 66 (11): 1316-1318; Dabbousi et al., 1997 "(CdSe)ZnS Core-Shell Quantum Dots: Synthesis and Characterization of a Size Series of Highly Luminescent Nanocrystallites," J. Phys. Chem. B, 101: 9463-9475; Ebenstein et al., 2002, "Fluorescence quantum yield of CdSe:ZnS nanocrystals investigated by correlated atomic-force and single-particle fluorescence microscopy," Applied Physics Letters 80: 1023-1025; and Peng et al., 2000, "Shape control of CdSe nanocrystals," Nature 104: 59-61; each of which is hereby incorporated by reference herein in its entirety.

In some embodiments, optical brighteners are used in the optional fluorescent layers of the present disclosure. Optical brighteners (also known as optical brightening agents, fluorescent brightening agents or fluorescent whitening agents) are dyes that absorb light in the ultraviolet and violet region of the electromagnetic spectrum, and re-emit light in the blue region. Such compounds include stilbenes (e.g., trans-1,2-diphenylethylene or (E)-1,2-diphenylethene). Another exemplary optical brightener that can be used in the optional fluorescent layers of the present disclosure is umbelliferone (7-hydroxycoumarin), which also absorbs energy in the UV portion of the spectrum. This energy is then re-emitted in the blue portion of the visible spectrum. More information on optical brighteners is in Dean, 1963, *Naturally Occurring Oxygen Ring Compounds*, Butterworths, London; Joule and Mills, 2000, *Heterocyclic Chemistry*, 4th edition, Blackwell Science, Oxford, United Kingdom; and Barton, 1999, *Comprehensive Natural Products Chemistry* 2: 677, Nakanishi and Meth-Cohn eds., Elsevier, Oxford, United Kingdom, 1999.

Circumferentially disposed. In some instances, the above-disclosed materials are successively circumferentially disposed on a nonplanar (e.g., cylindrical) substrate 102 in order to form a solar cell 12 of a photovoltaic device 10. As used herein, the term circumferentially disposed is not intended to imply that each such layer of material is necessarily deposited on an underlying layer. In fact, such layers could be molded or otherwise formed on an underlying layer. Nevertheless, the term circumferentially disposed means that an overlying layer is disposed on an underlying layer such that there is no annular space between the overlying layer and the underlying layer. Furthermore, as used herein, the term circumferentially disposed means that an overlying layer is disposed on at least fifty percent of the perimeter of the underlying layer. Furthermore, as used herein, the term circumferentially disposed means that an overlying layer is disposed along at least half of the length of the underlying layer.

Circumferentially sealed. As used herein, the term circumferentially sealed is not intended to imply that an overlying layer or structure is necessarily deposited on an underlying layer or structure. In fact, such layers or structures (e.g., transparent casing 310) can be molded or otherwise formed on an underlying layer or structure. Nevertheless, the term circumferentially sealed means that an overlying layer or structure is disposed on an underlying layer or structure such that there is no annular space between the overlying layer or structure and the underlying layer or structure. Furthermore, as used herein, the term circumferentially sealed means that an overlying layer is disposed on the full perimeter of the underlying layer. In typical embodiments, a layer or structure circumferentially seals an underlying layer or structure when it is circumferentially disposed around the full perimeter of the underlying layer or structure and along the full length of the underlying layer or structure. However, it is possible for a circumferentially sealing layer or structure does not extend along the full length of an underlying layer or structure.

Rigid. In some embodiments, the substrate 102 and/or the transparent casing 310 is rigid. Rigidity of a material can be measured using several different metrics including, but not limited to, Young's modulus. In solid mechanics, Young's Modulus (E) (also known as the Young Modulus, modulus of elasticity, elastic modulus or tensile modulus) is a measure of the stiffness of a given material. It is defined as the ratio, for small strains, of the rate of change of stress with strain. This can be experimentally determined from the slope of a stress-strain curve created during tensile tests conducted on a sample of the material. Young's modulus for various materials is given in the following table.

| Material | Young's modulus (E) in GPa | Young's modulus (E) in lbf/in² (psi) |
| --- | --- | --- |
| Rubber (small strain) | 0.01-0.1 | 1,500-15,000 |
| Low density polyethylene | 0.2 | 30,000 |
| Polypropylene | 1.5-2 | 217,000-290,000 |
| Polyethylene terephthalate | 2-2.5 | 290,000-360,000 |
| Polystyrene | 3-3.5 | 435,000-505,000 |
| Nylon | 3-7 | 290,000-580,000 |

-continued

| Material | Young's modulus (E) in GPa | Young's modulus (E) in lbf/in² (psi) |
| --- | --- | --- |
| Aluminum alloy | 69 | 10,000,000 |
| Glass (all types) | 72 | 10,400,000 |
| Brass and bronze | 103-124 | 17,000,000 |
| Titanium (Ti) | 105-120 | 15,000,000-17,500,000 |
| Carbon fiber reinforced plastic (unidirectional, along grain) | 150 | 21,800,000 |
| Wrought iron and steel | 190-210 | 30,000,000 |
| Tungsten (W) | 400-410 | 58,000,000-59,500,000 |
| Silicon carbide (SiC) | 450 | 65,000,000 |
| Tungsten carbide (WC) | 450-650 | 65,000,000-94,000,000 |
| Single Carbon nanotube | 1,000+ | 145,000,000 |
| Diamond (C) | 1,050-1,200 | 150,000,000-175,000,000 |

In some embodiments of the present application, a material (e.g., the substrate 102, the transparent casing 310, etc.) is deemed to be rigid when it is made of a material that has a Young's modulus of 20 GPa or greater, 30 GPa or greater, 40 GPa or greater, 50 GPa or greater, 60 GPa or greater, or 70 GPa or greater. In some embodiments a material (e.g., the substrate 102, the transparent casing 310, etc.) is deemed to be rigid when the Young's modulus for the material is a constant over a range of strains. Such materials are called linear, and are said to obey Hooke's law. Thus, in some embodiments, the substrate 102 is made out of a linear material that obeys Hooke's law. Examples of linear materials include, but are not limited to, steel, carbon fiber, and glass. Rubber and soil (except at very low strains) are non-linear materials. In some embodiments, a material is considered rigid when it adheres to the small deformation theory of elasticity, when subjected to any amount of force in a large range of forces (e.g., between 1 dyne and 105 dynes, between 1000 dynes and $10^6$ dynes, between 10,000 dynes and $10^7$ dynes), such that the material only undergoes small elongations or shortenings or other deformations when subject to such force. The requirement that the deformations (or gradients of deformations) of such exemplary materials are small means, mathematically, that the square of either of these quantities is negligibly small when compared to the first power of the quantities when exposed to such a force. Another way of stating the requirement for a rigid material is that such a material, over a large range of forces (e.g., between 1 dyne and $10^5$ dynes, between 1000 dynes and $10^6$ dynes, between 10,000 dynes and $10^7$ dynes), is well characterized by a strain tensor that only has linear terms. The strain tensor for materials is described in Borg, 1962, *Fundamentals of Engineering Elasticity*, Princeton, N.J., pp. 36-41, which is hereby incorporated by reference herein in its entirety. In some embodiments, a material is considered rigid when a sample of the material of sufficient size and dimensions does not bend under the force of gravity.

Non-planar. The present application is not limited to elongated photovoltaic modules and substrates that have rigid cylindrical shapes or are solid rods. In some embodiments, all or a portion of the substrate 102 can be characterized by a cross-section bounded by any one of a number of shapes other than the circular shape. The bounding shape can be any one of circular, ovoid, or any shape characterized by one or more smooth curved surfaces, or any splice of smooth curved surfaces. The bounding shape can be an n-gon, where n is 3, 5, or greater than 5. The bounding shape can also be linear in nature, including triangular, rectangular, pentangular, hexagonal, or having any number of linear segmented surfaces.

Or, the cross-section can be bounded by any combination of linear surfaces, arcuate surfaces, or curved surfaces.

In some embodiments, a first portion of the substrate 102 is characterized by a first cross-sectional shape and a second portion of the substrate 102 is characterized by a second cross-sectional shape, where the first and second cross-sectional shapes are the same or different. In some embodiments, at least zero percent, at least ten percent, at least twenty percent, at least thirty percent, at least forty percent, at least fifty percent, at least sixty percent, at least seventy percent, at least eighty percent, at least ninety percent or all of the length of the substrate 102 is characterized by the first cross-sectional shape. In some embodiments, the first cross-sectional shape is planar (e.g., has no arcuate side) and the second cross-sectional shape has at least one arcuate side.

Elongated. For purposes of defining the term "elongated" an object (e.g., substrate, elongated photovoltaic module, etc.) is considered to have a width dimension (short dimension, for example diameter of a cylindrical object) and a longitudinal (long) dimension. In some embodiments is deemed elongated when the longitudinal dimension of the object is at least four times greater than the width dimension. In other embodiments, an object is deemed to be elongated when the longitudinal dimension of the object is at least five times greater than the width dimension. In yet other embodiments, an object is deemed to be elongated when the longitudinal dimension of the object is at least six times greater than the width dimension of the object. In some embodiments, an object is deemed to be elongated when the longitudinal dimension of the object is 100 cm or greater and a cross section of the object includes at least one arcuate edge. In some embodiments, an object is deemed to be elongated when the longitudinal dimension of the object is 100 cm or greater and the object has a cylindrical shape. In some embodiments, the photovoltaic modules are elongated. In some embodiments, the substrates are elongated.

1.3 Exemplary Semiconductor Junctions

Figure 10A:
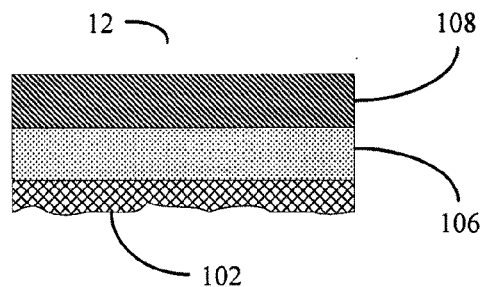
FIGS. 10A-10D illustrate semiconductor junctions that are used in various nonplanar solar cells.

Referring to FIG. 10A, in one embodiment, the semiconductor junction 106/108 is a heterojunction between an absorber layer 106, disposed on the conducting material 104, and a junction partner layer 108, disposed on the absorber layer 106. Layers 106 and 108 are composed of different semiconductors with different band gaps and electron affinities such that the junction partner layer 108 has a larger band gap than the absorber layer 106. In some embodiments, the absorber layer 106 is p-doped and the junction partner layer 108 is n-doped. In such embodiments, the transparent conducting layer 110 is $n^+$-doped. In alternative embodiments, the absorber layer 106 is n-doped and the junction partner layer 108 is p-doped. In such embodiments, the transparent conductive layer 110 is $p^+$-doped. In some embodiments, any of the semiconductors listed in Pandey, *Handbook of Semiconductor Electrodeposition*, Marcel Dekker Inc., 1996, Appendix 5, which is hereby incorporated by reference herein in its entirety, are used to form the semiconductor junction 106/108.

1.3.1 Thin-Film Semiconductor Junctions Based on Copper Indium Diselenide and Other Type I-III-VI Materials Continuing to refer to FIG. 10A, in some embodiments, the absorber layer 106 is a group I-III-$VI_2$ compound such as copper indium di-selenide ($CuInSe_2$; also known as CIS). In some embodiments, the absorber layer 106 is a group I-III-$VI_2$ ternary compound selected from the group consisting of $CdGeAs_2$, $ZnSnAs_2$, $CuInTe_2$, $AgInTe_2$, $CuInSe_2$, $CuGaTe_2$, $ZnGeAs_2$, $CdSnP_2$, $AgInSe_2$, $AgGaTe_2$, $CuInS_2$, $CdSiAs_2$, $ZnSnP_2$, $CdGeP_2$, $ZnSnAs_2$, $CuGaSe_2$, $AgGaSe_2$, $AgInS_2$, $ZnGeP_2$, $ZnSiAs_2$, $ZnSiP_2$, $CdSiP_2$, or $CuGaS_2$ of either the p-type or the n-type when such compound is known to exist.

In some embodiments, the junction partner layer 108 is CdS, ZnS, ZnSe, or CdZnS. In one embodiment, the absorber layer 106 is p-type CIS and the junction partner layer 108 is n-type CdS, ZnS, ZnSe, or CdZnS. Such semiconductor junctions 106/108 are described in Chapter 6 of Bube, *Photovoltaic Materials*, 1998, Imperial College Press, London, which is incorporated by reference herein in its entirety.

In some embodiments, the absorber layer 106 is copper-indium-gallium-diselenide (CIGS). Such a layer is also known as $Cu(InGa)Se_2$. In some embodiments, the absorber layer 106 is copper-indium-gallium-diselenide (CIGS) and the junction partner layer 108 is CdS, ZnS, ZnSe, or CdZnS. In some embodiments, the absorber layer 106 is p-type CIGS and the junction partner layer 108 is n-type CdS, ZnS, ZnSe, or CdZnS. Such semiconductor junctions 106/108 are described in Chapter 13 of *Handbook of Photovoltaic Science and Engineering*, 2003, Luque and Hegedus (eds.), Wiley & Sons, West Sussex, England, Chapter 12, which is incorporated by reference herein in its entirety. In some embodiments, CIGS is deposited using techniques disclosed in Beck and Britt, Final Technical Report, January 2006, NREL/SR-520-39119; and Delahoy and Chen, August 2005, "Advanced CIGS Photovoltaic Technology," subcontract report; Kapur et al., January 2005 subcontract report, NREL/SR-520-37284, "Lab to Large Scale Transition for Non-Vacuum Thin Film CIGS Solar Cells"; Simpson et al., October 2005 subcontract report, "Trajectory-Oriented and Fault-Tolerant-Based Intelligent Process Control for Flexible CIGS PV Module Manufacturing," NREL/SR-520-38681; and Ramanathan et al., $31^{st}$ IEEE Photovoltaics Specialists Conference and Exhibition, Lake Buena Vista, Fla., Jan. 3-7, 2005, each of which is hereby incorporated by reference herein in its entirety.

In some embodiments the absorber layer 106 is CIGS grown on a molybdenum conducting material 104 by evaporation from elemental sources in accordance with a three stage process described in Ramanthan et al., 2003, "Properties of 19.2% Efficiency $ZnO/CdS/CuInGaSe_2$ Thin-film Solar Cells," Progress in Photovoltaics: Research and Applications 11, 225, which is hereby incorporated by reference herein in its entirety. In some embodiments, the layer 504 is a ZnS(O,OH) buffer layer as described, for example, in Ramanathan et al., Conference Paper, "CIGS Thin-Film Solar Research at NREL: FY04 Results and Accomplishments," NREL/CP-520-37020, January 2005, which is hereby incorporated by reference herein in its entirety.

In some embodiments, the absorber layer 106 is between 0.5 μm and 2.0 μm thick. In some embodiments, the composition ratio of Cu/(In+Ga) in the layer 106 is between 0.7 and 0.95. In some embodiments, the composition ratio of Ga/(In+Ga) in the layer 106 is between 0.2 and 0.4. In some embodiments, the absorber layer 106 is CIGS that has a <110> crystallographic orientation. In some embodiments, the absorber layer 106 is CIGS that has a <112> crystallographic orientation. In some embodiments, the absorber layer 106 is CIGS in which the CIGS crystals are randomly oriented.

1.3.2 Semiconductor Junctions Based on Amorphous Silicon or Polycrystalline Silicon In some instances, layers having reference numerals other than 106 and 108 are used to describe layers that may be in a semiconductor junction 106/108. It will be appreciated that such layers can be used instead of the layers 106 and 108 that are depicted in FIG. 2. In some embodiments, the semiconductor junction 106/108 comprises amorphous silicon. In some embodiments, this is an n/n type heterojunction. For example, in some embodiments, referring to FIG. 10B, the semiconductor junction 106/108 comprises $SnO_2(Sb)$, the layer 512 comprises undoped amorphous silicon, and the layer 510 comprises n+ doped amorphous silicon.

In some embodiments, the semiconductor junction 106/108 is a p-i-n type junction. For example, in some embodiments, the semiconductor junction 106/108 comprises a layer 514 that is $p^+$ doped amorphous silicon, a layer 512 that is undoped amorphous silicon, and a layer 510 that is $n^+$ amorphous silicon. Such semiconductor junctions 106/108 are described in Chapter 3 of Bube, *Photovoltaic Materials*, 1998, Imperial College Press, London, which is hereby incorporated by reference herein in its entirety.

Figure 10B:
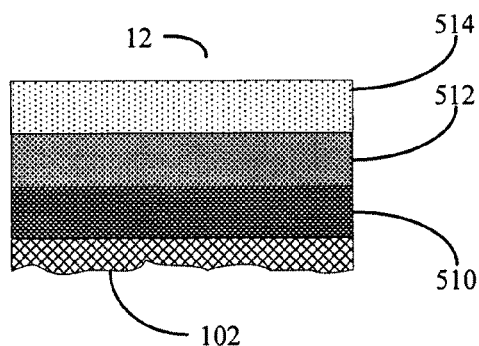

In some embodiments, the semiconductor junction 106/108 is based upon thin-film polycrystalline. Referring to FIG. 10B, in one example in accordance with such embodiments, layer 510 is a p-doped polycrystalline silicon, layer 512 is depleted polycrystalline silicon and layer 514 is n-doped polycrystalline silicon. Such semiconductor junctions are described in Green, *Silicon Solar Cells: Advanced Principles & Practice*, Centre for Photovoltaic Devices and Systems, University of New South Wales, Sydney, 1995; and Bube, *Photovoltaic Materials*, 1998, Imperial College Press, London, pp. 57-66, which is hereby incorporated by reference in its entirety.

In some embodiments, the semiconductor junction 106/108 is based upon p-type microcrystalline Si:H and microcrystalline Si:C:H in an amorphous Si:H context. Such semiconductor junctions are described in Bube, *Photovoltaic Materials*, 1998, Imperial College Press, London, pp. 66-67, and the references cited therein, which is hereby incorporated by reference herein in its entirety.

In some embodiments, the semiconductor junction 106/108 is a tandem junction. Tandem junctions are described in, for example, Kim et al., 1989, "Lightweight (AlGaAs)GaAs/CuInSe2 Tandem Junction Solar Cells for Space Applications," Aerospace and Electronic Systems Magazine, IEEE Volume 4, pp: 23-32; Deng, 2005, "Optimization of a-SiGe Based Triple, Tandem and Single-junction Solar Cells," Photovoltaic Specialists Conference, Conference Record of the Thirty-first IEEE, pp: 1365-1370; Arya et al., 2000, "Amorphous Silicon Based Tandem Junction Thin-film Technology: a Manufacturing Perspective," Photovoltaic Specialists Conference, 2000, Conference Record of the Twenty-Eighth IEEE 15-22, pp: 1433-1436; Hart, 1988, "High Altitude Current-voltage Measurement of GaAs/Ge solar cells," Photovoltaic Specialists Conference, Conference Record of the Twentieth IEEE 26-30, pp: 764-765, vol. 1; Kim, 1988, "High Efficiency GaAs/CuInSe$_2$ Tandem Junction Solar Cells," Photovoltaic Specialists Conference, Conference Record of the Twentieth IEEE 26-30, pp: 457-461 vol. 1; Mitchell, 1988, "Single and Tandem Junction CuInSe$_2$ Cell and Module Technology," Photovoltaic Specialists Conference, Conference Record of the Twentieth IEEE 26-30, pp: 1384-1389, vol. 2; and Kim, 1989, "High Specific Power (AlGaAs)GaAs/CuInSe$_2$ Tandem Junction Solar Cells for Space Applications," Energy Conversion Engineering Conference, IECEC-89, Proceedings of the 24$^{th}$ Intersociety 6-11, pp: 779-784, vol. 2, each of which is hereby incorporated by reference herein in its entirety.

1.3.3 Semiconductor Junctions Based on Gallium Arsenide and Other Type III-V Materials In some embodiments, the semiconductor junction 106/108 is based upon gallium arsenide (GaAs) or other III-V materials such as InP, AlSb, and CdTe. GaAs is a direct-band gap material having a band gap of 1.43 eV and can absorb 97% of AM1 radiation in a thickness of about two microns. Suitable type III-V junctions that can serve as semiconductor junctions 106/108 are described in Chapter 4 of Bube, *Photovoltaic Materials*, 1998, Imperial College Press, London, which is hereby incorporated by reference herein in its entirety.

Furthermore, in some embodiments, the semiconductor junction 106/108 is a hybrid multijunction solar cell such as a GaAs/Si mechanically stacked multijunction as described by Gee and Virshup, 1988, 20$^{th}$ *IEEE Photovoltaic Specialist Conference*, IEEE Publishing, New York, p. 754, which is incorporated by reference herein in its entirety, a GaAs/CuInSe$_2$ MSMJ four-terminal device, consisting of a GaAs thin film top cell and a ZnCdS/CuInSe$_2$ thin bottom cell described by Stanbery et al., 19$^{th}$ *IEEE Photovoltaic Specialist Conference*, IEEE Publishing, New York, p. 280, and Kim et al., 20$^{th}$ *IEEE Photovoltaic Specialist Conference*, IEEE Publishing, New York, p. 1487, each of which is hereby incorporated by reference herein in its entirety. Other hybrid multijunction solar cells are described in Bube, *Photovoltaic Materials*, 1998, Imperial College Press, London, pp. 131-132, which is hereby incorporated by reference herein in its entirety.

Figure 10C:
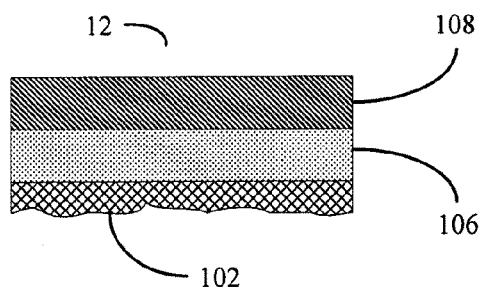
Figure 10D:
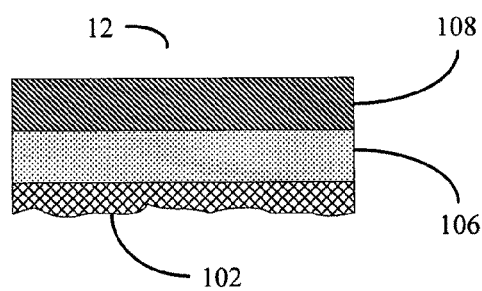

1.3.4 Semiconductor Junctions Based on Cadmium Telluride and Other Type II-VI Materials In some embodiments, the semiconductor junction 106/108 is based upon II-VI compounds that can be prepared in either the n-type or the p-type form. Accordingly, in some embodiments, referring to FIG. 10C, the semiconductor junction 106/18 is a p-n heterojunction in which the layers 106 and 108 are any combination set forth in the following table or alloys thereof.

| Layer 106 | Layer 108 |
|---|---|
| n-CdSe | p-CdTe |
| n-ZnCdS | p-CdTe |
| n-ZnSSe | p-CdTe |
| p-ZnTe | n-CdSe |
| n-CdS | p-CdTe |
| n-CdS | p-ZnTe |
| p-ZnTe | n-CdTe |
| n-ZnSe | p-CdTe |
| n-ZnSe | p-ZnTe |
| n-ZnS | p-CdTe |
| n-ZnS | p-ZnTe |

Methods for manufacturing a semiconductor junction 106/108 that is based upon II-VI compounds is described in Chapter 4 of Bube, *Photovoltaic Materials*, 1998, Imperial College Press, London, which is hereby incorporated by reference herein in its entirety for such purpose.

1.3.5 Semiconductor Junctions Based on Crystalline Silicon

While semiconductor junctions 106/108 that are made from thin film semiconductor films are preferred, the disclosure is not so limited. In some embodiments the semiconductor junctions 106/108 are based upon crystalline silicon. For example, referring to FIG. 5D, in some embodiments, the semiconductor junction 106/108 comprises a layer of p-type crystalline silicon 106 and a layer of n-type crystalline silicon 108. Methods for manufacturing such crystalline silicon semiconductor junctions 106/108 are described in Chapter 2 of Bube, *Photovoltaic Materials*, 1998, Imperial College Press, London, which is hereby incorporated by reference herein in its entirety.

1.4 Monolithic Photovoltaic Devises

The photovoltaic apparatuses disclosed in the present disclosure can be used with monolithically integrated solar devices such as those described in U.S. Pat. No. 7,235,736, which is hereby incorporated by reference herein, in which the inner substrate is hollowed and sealed with a diaphragm 50. As in other embodiments disclosed herein, in nonplanar embodiments, the hollowed substrate 102 is sealed at each end. At least one of these seals is formed by a diaphragm 50 as depicted in FIG. 9. The other seal, not shown in FIG. 9, can be formed by another diaphragm 50 or by a rigid cap thereby defining a volume compensating inner volume.

Figure 9A:
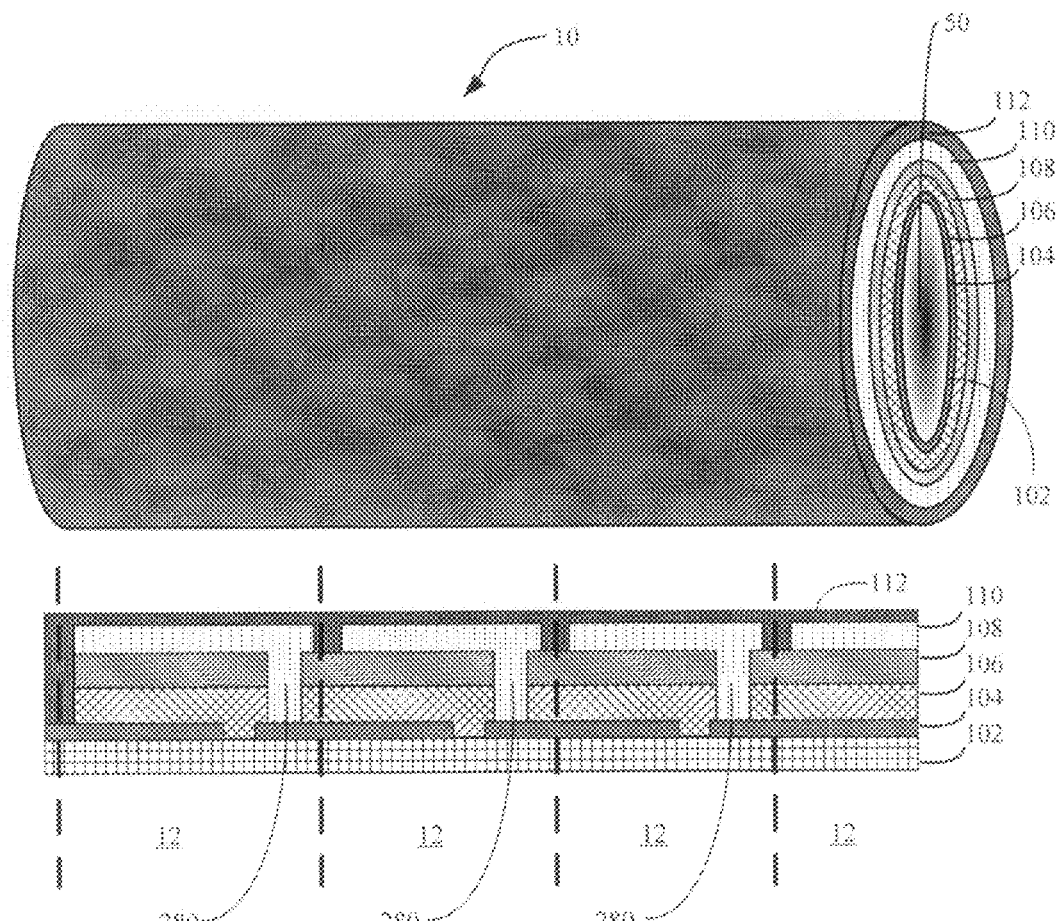
FIG. 9A illustrates a perspective view of a nonplanar photovoltaic device that includes a plurality of solar cells on a common substrate arranged in series that is manufactured using a cascade technique.

Referring to FIG. 9A, in some embodiments of the present disclosure, photovoltaic device 10 comprises a plurality of solar cells 12 on a common substrate 102. The solar cells 12 are monolithically integrated and electrically arranged in series. The upper portion of FIG. 9A shows the three-dimensional tubular profile of the photovoltaic device 10. Below the three-dimensional tubular profile is a corresponding one-dimensional profile of the photovoltaic device. What is shown in the one-dimensional profile is a cross-sectional view of one hemisphere of the photovoltaic device 10. In typical monolithic embodiments, the substrate 102 is not an electrical conductor. In the alternative, in embodiments where the substrate 102 is electrically conducting, the substrate is circumferentially wrapped with an insulator layer so that the transparent conducting material 104 of individual solar cells 12 are electrically isolated from each other.

Referring to FIG. 9A, the photovoltaic device 10 comprises a substrate 102 common to a plurality of solar cells 12. The substrate 102 has a first end and a second end. The plurality of solar cells 12 are linearly arranged on the substrate 102 as illustrated in FIG. 2K. The plurality of solar cells 12 comprises a first and second solar cell 12. Each solar cell 12 in the plurality of solar cells comprises a conducting material 104 circumferentially disposed on a common substrate 102 and a semiconductor junction 106/108 circumferentially disposed on the conducting material 104. In the case of FIG. 9A, semiconductor junction 106/108 comprises an absorber 106 and a window layer 108. Each solar cell 12 in the plurality of solar cells further comprises a transparent conducting material 110 circumferentially disposed on the semiconductor junction 106/108. In the case of FIG. 9A, the transparent conducting layer 110 of the first solar cell 12 is in serial electrical communication with the conducting material 104 of the second solar cell in the plurality of solar cells through electrically conducting vias 280. In some embodiments, each via 280 extends the full circumference of the photovoltaic device 10. In some embodiments, each via 280 does not extend the full circumference of the photovoltaic device. In fact, in some embodiments, each via 280 only extends a small percentage of the circumference of the photovoltaic device 10. In some embodiments, each solar cell 12 may have one, two, three, four or more, ten or more, or one hundred or more vias 280 that electrically connect in series the transparent conducting layer 110 of the solar cell 12 with the conducting material 104 of an adjacent solar cell 12.

Figure 9B:
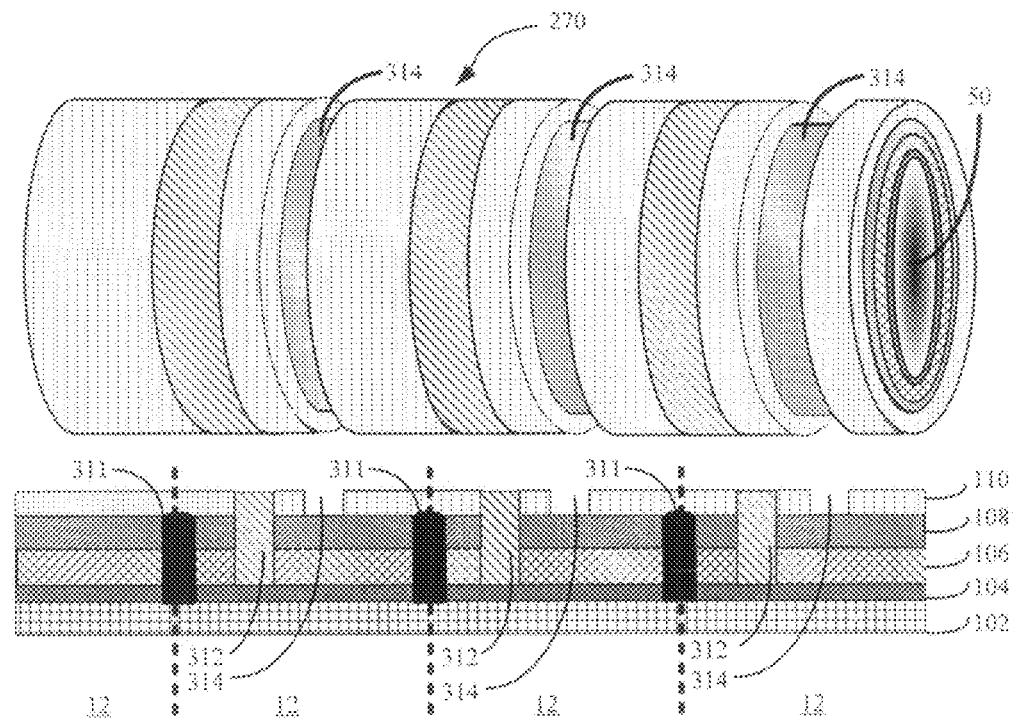
FIG. 9B illustrates a perspective view of a nonplanar photovoltaic device that includes a plurality of solar cells on a common substrate arranged in series that is manufactured using a first post absorber technique.

Referring to FIG. 9B, another embodiment of a monolithically integrated photovoltaic device 10 is shown in which grooves 314 and insulating posts 311 are used to form solar cells 12 such that the transparent conducting layer 110 of one solar cell 12 on substrate 102 is serially connected to the conducting material 104 of an adjacent solar cell 12 through an electrically conducting via 312 but the two solar cells 12 are otherwise electrically isolated from each other. In some embodiments, grooves 314, posts 314 and vias 313 are not concentric as illustrated in FIG. 9B. Rather, in some embodiments, they are spiraled down the cylindrical (long) axis of substrate 102.

Figure 9C:
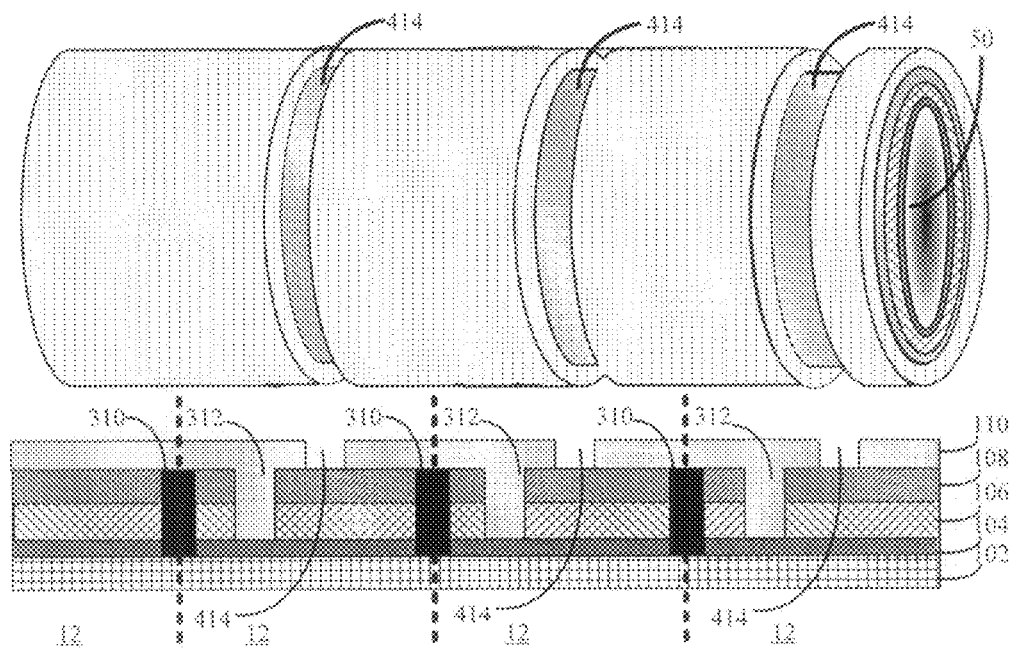
FIG. 9C illustrates a perspective view of a nonplanar photovoltaic device that includes a plurality of solar cells on a common substrate arranged in series that is manufactured using a second post absorber technique.

Referring to FIG. 9C, another embodiment of a monolithically integrated photovoltaic device 10 is shown in which grooves 414 and insulating posts 311 are used to form solar cells 12 such that the transparent conducting layer 110 of one solar cell 12 on the substrate 102 is serially connected to the conducting material 104 of an adjacent solar cell 12 through an electrically conducting via 312 but the two solar cells 12 are otherwise electrically isolated from each other. In some embodiments, grooves 414 are not concentric as illustrated in FIG. 9C. Rather, in some embodiments, such grooves are spiraled down the cylindrical (long) axis of substrate 102.

Figure 9D:
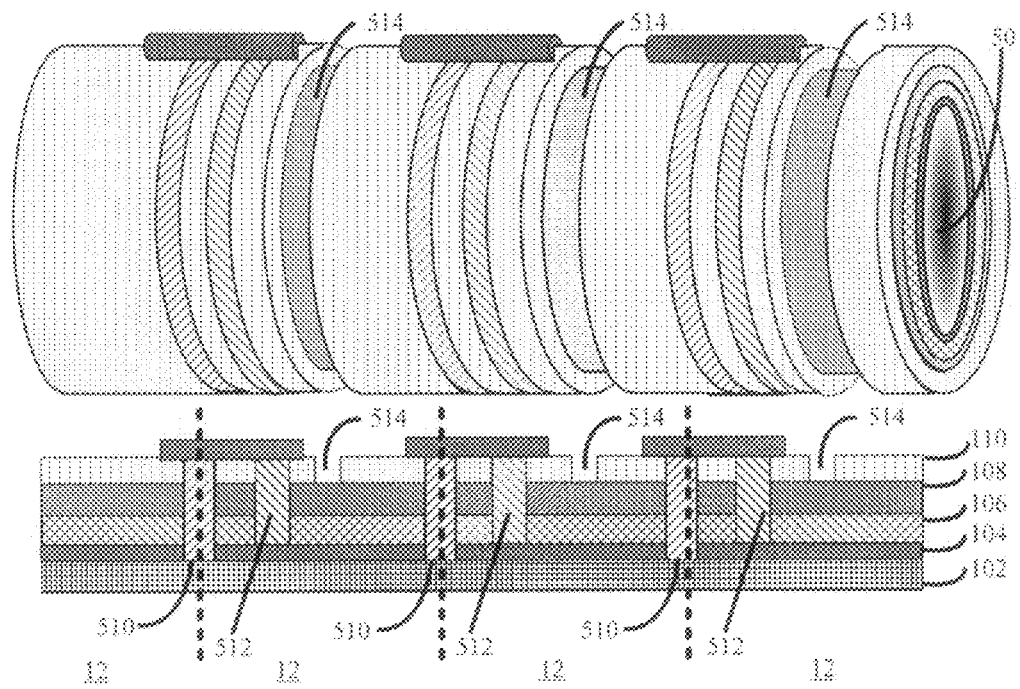
FIG. 9D illustrates a perspective view of a nonplanar photovoltaic device that includes a plurality of solar cells on a common substrate arranged in series that is manufactured using a first post device technique in accordance with the present disclosure.

Referring to FIG. 9D, another embodiment of a monolithically integrated photovoltaic device 10 is shown in which a first post device technique is used to make the device. In the photovoltaic device 10 depicted in FIG. 9D, grooves 514 and insulating post 510 are used to form solar cells 12 such that the transparent conducting layer 110 of one solar cell 12 on substrate 102 is serially connected to the conducting material 104 of an adjacent solar cell 12 through electrically conducting via 512 but the two solar cells 12 are otherwise electrically isolated from each other. In some embodiments, the grooves 514, insulating posts 510 and vias 512 are not concentric as illustrated in FIG. 9D. Rather, in some embodiments, such grooves are spiraled down the cylindrical (long) axis of the substrate 102.

Figure 9E:
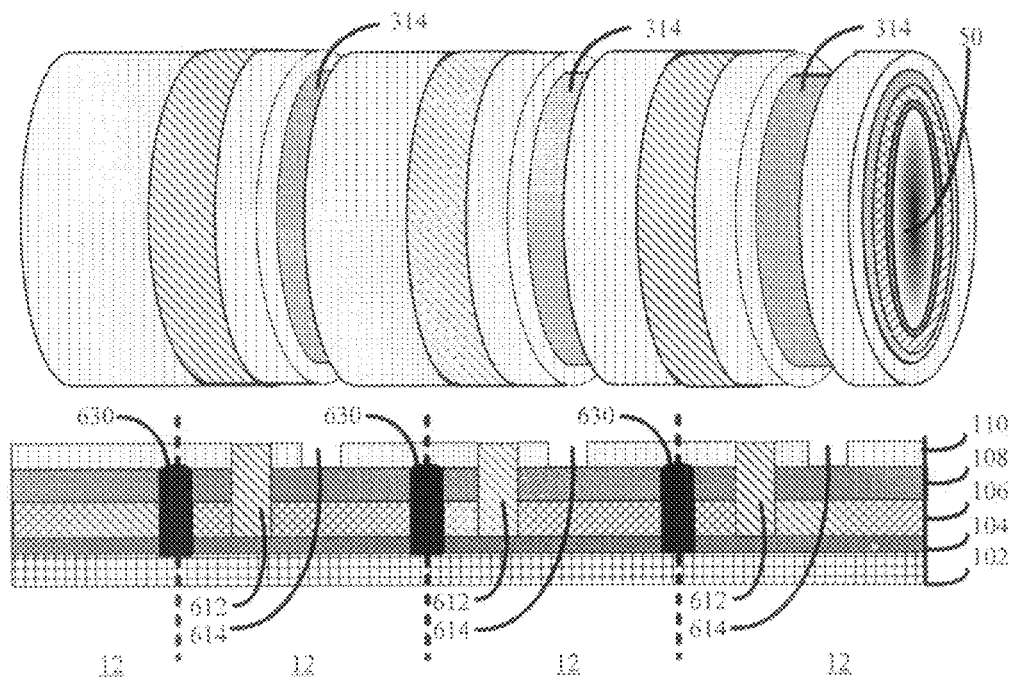
FIG. 9E illustrates a perspective view of a nonplanar photovoltaic device that includes a plurality of solar cells on a common substrate arranged in series that is manufactured using a second post device technique in accordance with the present disclosure.

Referring to FIG. 9E, another embodiment of a monolithically integrated photovoltaic device 10 is shown in which a second post device technique is used to make the device. In the photovoltaic device 10 depicted in FIG. 9E, grooves 614 and insulating post 630 are used to form solar cells 12 such that the transparent conducting layer 110 of one solar cell 12 on substrate 102 is serially connected to the conducting material 104 of an adjacent solar cell 12 through electrically conducting via 612 but the two solar cells 12 are otherwise electrically isolated from each other. In some embodiments, the grooves 614, insulating posts 630 and vias 612 are not concentric as illustrated in FIG. 9E. Rather, in some embodiments, such grooves are spiraled down the cylindrical (long) axis of the substrate 102.

1.5 Exemplary Dimensions

Figure 3A:
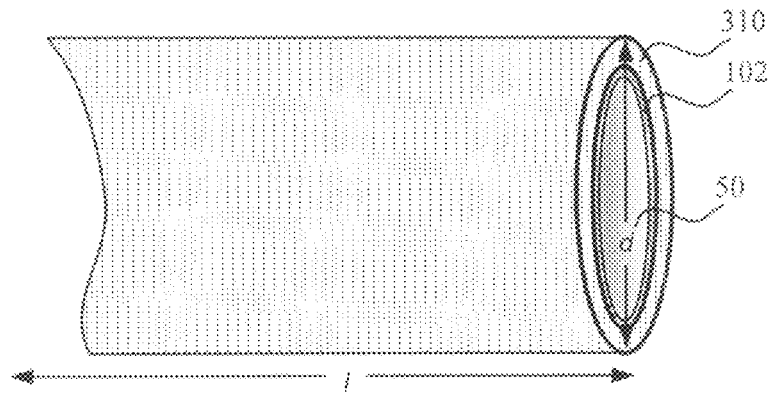
FIG. 3A illustrates a partial perspective view of a nonplanar photovoltaic device having a diaphragm.
Figure 3B:
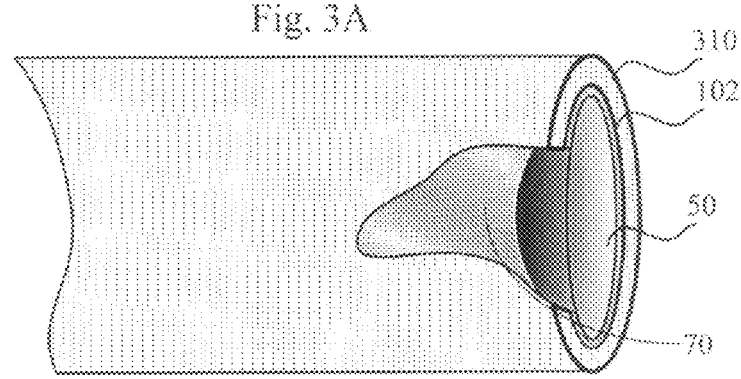
FIG. 3B illustrates a partial perspective view of the nonplanar photovoltaic device of FIG. 3A with a cutaway to further illustrate the diaphragm.
Figure 3C:
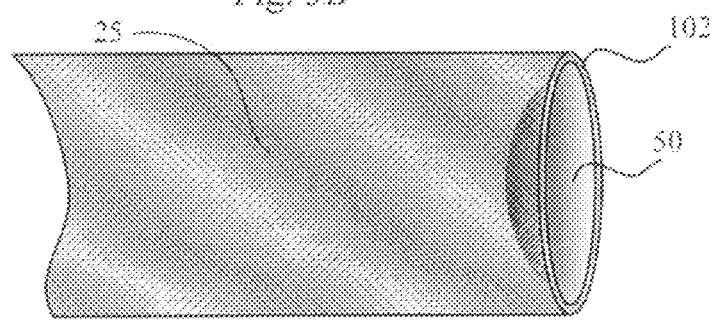
FIG. 3C illustrates a partial perspective view of the nonplanar photovoltaic device of FIG. 3A with all but the hollow inner substrate core and diaphragm removed.
Figure 3D:
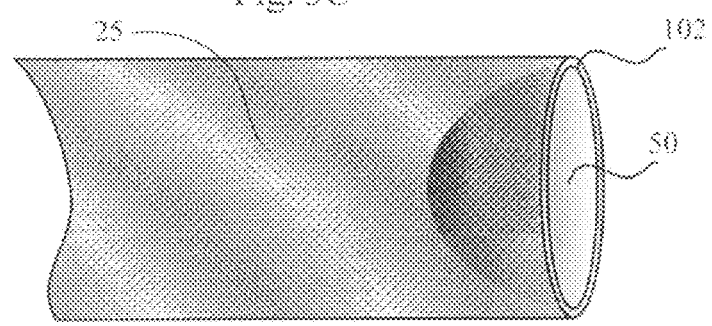
FIG. 3D illustrates a partial perspective view of the nonplanar photovoltaic device of FIG. 3C in which the diaphragm has expanded into the hollow inner substrate core.

As illustrated in FIGS. 2 and 3A, a nonplanar photovoltaic device 10 has a length l that is great compared to the diameter d of its cross-section. In some embodiments, a photovoltaic device 10 has a length l between 1 centimeter (cm) and 50,000 cm and a width d between 1 cm and 50,000 cm. In some embodiments, a photovoltaic device 10 has a length l between 10 cm and 1,000 cm and a width d between 10 cm and 1,000 cm. In some embodiments, a photovoltaic device 10 has a length l between 40 cm and 500 cm and a width d between 40 cm and 500 cm.

In some embodiments, a photovoltaic device 10 has the planar configuration illustrated in FIG. 8A. Referring to FIG. 8A, in such embodiments, the photovoltaic device 10 may have a length x of between 1 cm and 10,000 cm. Further, the photovoltaic device 10 may have a width of between 1 cm and 10,000 cm.

In some embodiments, a photovoltaic device 10 may be elongated as illustrated in FIG. 4 through 9. As illustrated in FIGS. 2 and 3A, an elongated photovoltaic device 10 is one that is characterized by having a longitudinal dimension l and a width dimension d. In some embodiments of an elongated photovoltaic device 10, the longitudinal dimension l exceeds the width dimension d by at least a factor of 4, at least a factor of 5, or at least a factor of 6. In some embodiments, the longitudinal dimension l of the elongated photovoltaic device is 10 centimeters or greater, 20 centimeters or greater, 100 centimeters or greater. In some embodiments, the width dimension d of the elongated photovoltaic device 10 is a width of 500 millimeters or more, 1 centimeter or more, 2 centimeters or more, 5 centimeters or more, or 10 centimeters or more.

The solar cells 12 of the photovoltaic devices 10 may be made in various ways and have various thicknesses. The solar cells 12 as described herein may be so-called thick-film semiconductor structures or a so-called thin-film semiconductor structures.

In some embodiments, a container 25 has a length that is great compared to the diameter of its cross-section. In some embodiments, a container 25 has a length between 1 cm and 50,000 cm and a width between 1 cm and 50,000 cm. In some embodiments, a container 25 has a length between 10 cm and 1,000 cm and a width between 10 cm and 1,000 cm. In some embodiments, a container has a length between 40 cm and 500 cm and a width between 40 cm and 500 cm. In some embodiments, a container 25 is dimensioned to have a container volume of at least one cubic centimeter, at least 10 cubic centimeters, at least 20 cubic centimeters, at least 30 cubic centimeters, at least 50 cubic centimeters, at least 100 cubic centimeters, or at least 1000 cubic centimeters.

1.6 Exemplary Embodiments

One aspect of the disclosure provides a photovoltaic device comprising (i) an outer transparent casing, (ii) a substrate, the substrate and the outer transparent casing defining an inner volume, (iii) at least one solar cell disposed on the substrate, (iv) a filler layer that seals the at least one solar cell within the inner volume, (v) a container within the inner volume, the container defined by at least one wall and an opening, where the opening is in fluid communication with the filler layer, (vi) a diaphragm affixed to the opening of the container, where the diaphragm seals the opening from the filler layer and thereby defines a container volume. The diaphragm is configured to decrease the container volume when the filler layer thermally expands and increase the container volume when the filler layer thermally contracts.

In some embodiments, the substrate has a hollow core and the container is formed in the hollow core. In some embodiments, the substrate is cylindrical. In some embodiments, the substrate is planar and the container is immersed in the filler layer. In some embodiments, the substrate is cylindrical and the container is immersed in the filler layer between a solar cell in the at least one solar cell and the outer transparent casing.

In some embodiments, the outer transparent casing is tubular and encapsulates the substrate. In some embodiments, the substrate has a hollow core and the container is formed in the hollow core. In some embodiments, the diaphragm is configured to decrease the container volume by up to 5 percent during operation of the photovoltaic device, by up to 20 percent during operation of the photovoltaic device, or by up to 30 percent during operation of the photovoltaic device. In some embodiments, the filler layer has a volumetric thermal coefficient of expansion of greater than $250 \times 10^{-6}/^\circ$ C., or greater than $2000 \times 10^{-6}/^\circ$ C.

In some embodiments, a solar cell in the at least one solar cell comprises a conducting material disposed on the substrate, a semiconductor junction disposed on the conducting material, and a transparent conducting layer disposed on the semiconductor junction. In some embodiments, the semiconductor junction comprises a homojunction, a heterojunction, a heteroface junction, a buried homojunction, a p-i-n junction, or a tandem junction. In some embodiments, the semiconductor junction comprises an absorber layer and a junction partner layer, where the junction partner layer is disposed on the absorber layer. In some embodiments, the absorber layer is copper-indium-gallium-diselenide and the junction partner layer is $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$, or doped ZnO. In some embodiments, the photovoltaic device further comprises an antireflective coating disposed on the outer transparent casing. In some embodiments, the antireflective coating comprises $MgF_2$, silicone nitrate, titanium nitrate, silicon monoxide, or silicone oxide nitrite.

In some embodiments, the substrate of the photovoltaic device comprises plastic or glass. In some embodiments, the substrate of the photovoltaic device comprises metal or metal alloy. In some embodiments, the photovoltaic device further comprises an additional one or more containers and each respective container in the one or more containers is within the inner volume, each respective container in the one or more containers is defined by at least one wall and an opening that is in fluid communication with the filler layer; and a diaphragm is affixed to each opening of each respective container in the one or more containers.

In some embodiments, the diaphragm comprises a concave extension that fits into the container and a head that fits around a perimeter of the opening. In some embodiments, the diaphragm comprises a plug and, under conditions of low filler layer pressure, the diaphragm is inserted into the container and, under conditions of high filler layer pressure, the diaphragm expands and adopts a position in the interior of the container. In some embodiments, a head of the diaphragm comprises an expandable or resilient ring and the ring is compressed to fit into the opening of the container thereby expanding and creating a force against the at least one wall of the container and sealing the opening In some embodiments, the diaphragm has a lip and that is dimensioned so that it cannot be pressed completely through the opening and into the container. In some embodiments, the diaphragm is a made of rubber, a rubberlike material, a rubber derivative, silicone rubber, or an elastomer.

In some embodiments, the at least one solar cell comprises a plurality of solar cells that are monolithically integrated onto the substrate. In some embodiments, such solar cells are electrically connected in series. In some embodiments, such solar cells are electrically connected in parallel. In some embodiments, the diaphragm is concave with respect to a plane of the opening.

Another aspect of the disclosure provides a photovoltaic device comprising (i) a cylindrical outer transparent casing, (ii) a cylindrical substrate, where the cylindrical substrate and the cylindrical outer transparent casing define an annular inner volume, and where all or a portion of a core of the cylindrical substrate is hollowed to form a container with at least one opening, (iii) at least one solar cell circumferentially disposed on the substrate, (iv) a filler layer that occupies the annular inner volume, thereby sealing the at least one solar cell, and (v) a diaphragm affixed to an opening of the container, where the diaphragm seals the container from the filler layer and thereby defines a container volume. Here, the diaphragm is configured to decrease the container volume when the filler layer thermally expands and increase the container volume when the filler layer thermally contracts.

Another aspect of the disclosure provides a photovoltaic device comprising (i) an outer transparent casing, (ii) a substrate, the substrate and the outer transparent casing defining an inner volume, (iii) at least one solar cell disposed on the substrate, (iv) a filler layer that seals the at least one solar cell within the inner volume, (v) a container within the inner volume, the container defined by at least one wall and an opening, where the opening is in fluid communication with the filler layer, and (vi) a diaphragm, where the diaphragm comprises a plug and where, under conditions of low filler layer pressure, the diaphragm is inserted into the container through the opening and, under conditions of high filler layer pressure, the diaphragm expands and adopts a position in the interior of the container.

Still another aspect of the disclosure provides a photovoltaic device comprising (i) an outer transparent casing, (ii) a substrate, the substrate and the outer transparent casing defining an inner volume, (iii) at least one solar cell disposed on the substrate, (iv) a filler layer that seals the at least one solar cell within the inner volume, (v) a container within the inner volume, the container defined by at least one wall and an opening, where the opening is in fluid communication with the filler layer, and (vi) a diaphragm, where a head of the diaphragm comprises an expandable or resilient ring and where the ring is compressed to fit into the opening of the container thereby expanding and creating a force against the at least one wall of the container and sealing the opening to create a container volume within the container. Here, the diaphragm is configured to (i) decrease the container volume when the filler layer thermally expands, and (ii) increase the container volume when the filler layer thermally contracts.

Yet another aspect of the disclosure is a photovoltaic device comprising (i) an outer transparent casing, (ii) a substrate, the substrate and the outer transparent casing defining an inner volume, (iii) at least one solar cell disposed on the substrate, (iv) a filler layer that seals the at least one solar cell within the inner volume, (v) a container within the inner volume, the container defined by at least one wall and an opening, where the opening is in fluid communication with the filler layer, and (vi) a diaphragm affixed to the opening of the container, where the diaphragm has a lip and where the lip is dimensioned so that it cannot be pressed completely through the opening and into the container. Here, the diaphragm is configured to decrease the container volume when the filler layer thermally expands and increase the container volume when the filler layer thermally contracts.

Still another aspect of the disclosure provides a photovoltaic device comprising (i) an outer transparent casing, (ii) a substrate, the substrate and the outer transparent casing defining an inner volume, (iii) at least one solar cell disposed on the substrate, (iv) a filler layer that seals the at least one solar cell within the inner volume, (v) a container within the inner volume, the container defined by at least one wall and an opening, where the opening opens to the filler layer and (vi) a diaphragm affixed to the opening of the container, where the diaphragm seals the opening from the filler layer and thereby defines a container volume, and where the diaphragm is concave with respect to a plane of the opening. Here, the diaphragm is configured to decrease the container volume when the filler layer thermally expands and increase the container volume when the filler layer thermally contracts.

Still another aspect provides a photovoltaic device comprising a sealed outer transparent casing defining a first volume and a filler layer, disposed within the sealed outer transparent casing, that expands in volume when the temperature increases and contracts in volume when the temperature decreases. The photovoltaic device further comprises a photovoltaic module, substantially disposed within the first volume. The photovoltaic module comprises a substrate comprising at least one solar cell disposed upon it and comprising a first lateral end and a second lateral end. The photovoltaic module further comprises a diaphragm associated with and substantially sealing an opening at the first lateral end of the substrate, the diaphragm and the substrate defining an inner volume. The filler layer substantially encapsulates the photovoltaic module. The inner volume decreases in volume when the filler layer expands. The inner volume increases in volume when the filler layer contracts.

Still another aspect of the disclosure provides a photovoltaic device comprising a sealed outer transparent casing defining a first volume and a filler layer, disposed within the transparent casing, which expands in volume when the temperature increases and contracts in volume when the temperature decreases. The photovoltaic device further comprises a photovoltaic module, substantially disposed within the first volume. The photovoltaic module comprises a tubular substrate comprising an exterior surface, a first lateral end, and a second lateral end. The tubular substrate further comprises at least one solar cell disposed upon the exterior surface. The photovoltaic module further comprises a diaphragm associated with and substantially sealing an opening at the first lateral end of the substrate, the diaphragm and the tubular substrate defining an inner volume. The filler layer substantially encapsulates the photovoltaic module. The inner volume decreases in volume when the filler layer expands. The inner volume increases in volume when the filler layer contracts.

1.7 Additional Embodiments

What follows in this section are non-limiting exemplary embodiments in accordance with the present application.

Embodiment 1

A photovoltaic device comprising:

a) a sealed outer transparent casing defining an inner volume;

b) a substrate disposed within the inner volume;

c) at least one solar cell disposed on the substrate within the inner volume;

d) a filler layer that occupies a space between the substrate and the transparent casing in the inner volume thereby sealing the at least one solar cell, wherein the filler layer comprises a filler composition;

e) a first container within the inner volume, the container defined by at least one wall and an opening, wherein the opening opens to the filler layer; and f) a diaphragm sealing the first container from the filler layer thereby defining a container volume within the container.

Embodiment 2

The photovoltaic device of embodiment 1, wherein the container volume does not contain the filler composition.

Embodiment 3

The photovoltaic device of embodiment 1, wherein at least a portion of the container volume does not contain the filler composition.

Embodiment 4

The photovoltaic device of any one of embodiments 1-3, the photovoltaic device further comprising a plurality of containers within the inner volume, the plurality of containers including the first container, and wherein
each container in the plurality of containers is defined by at least one wall and an opening;
the opening of each container in the plurality of containers opens to the filler layer; and
each respective container in the plurality of containers comprises a diaphragm sealing the respective container from the filler layer thereby defining a respective container volume within the container.

Embodiment 5

The photovoltaic device of any one of embodiments 1-3, wherein the diaphragm is affixed to the opening and seals the opening from the filler layer, and wherein the diaphragm is configured to decrease the container volume when the filler layer thermally expands; and
increase the container volume when the filler layer thermally contracts.

Embodiment 6

The photovoltaic device of any one of embodiments 1-3, wherein the diaphragm comprises a plug;
the diaphragm is inserted into the first container through the opening under conditions of low filler layer pressure; and
the diaphragm expands and adopts a position in the interior of the first container under conditions of high filler layer pressure.

Embodiment 7

The photovoltaic device of any one of embodiments 1-3, wherein
the diaphragm comprises a plug;
the diaphragm is inserted into the first container through the opening under conditions of low filler layer temperature; and
the diaphragm expands and adopts a position in the interior of the first container under conditions of high filler layer temperature.

Embodiment 8

The photovoltaic device of any one of embodiments 1-3, wherein the diaphragm includes a head that comprises an expandable or resilient ring that is compressed to fit into the opening of the first container thereby expanding and creating a force against the at least one wall of the first container and sealing the opening and wherein the diaphragm is configured to:
decrease the container volume when the filler layer thermally expands, and
increase the container volume when the filler layer thermally contracts.

Embodiment 9

The photovoltaic device of any one of embodiments 1-3, wherein the diaphragm is affixed to the opening of the first container;
the diaphragm comprises a lip that is dimensioned so that it cannot be pressed completely through the opening and into the first container; and
the diaphragm is configured to:
decrease the container volume when the filler layer thermally expands, and
increase the container volume when the filler layer thermally contracts.

Embodiment 10

The photovoltaic device of any one of embodiments 1-3, wherein
the opening is in fluid communication with the filler layer;
the diaphragm is affixed to the opening of the first container;
the diaphragm is concave with respect to a plane of the opening; and
the diaphragm is configured to:
decrease the container volume when the filler layer thermally expands, and
increase the container volume when the filler layer thermally contracts.

Embodiment 11

The photovoltaic device of any one of embodiments 1-3, wherein
the outer transparent casing is cylindrical;
the substrate is cylindrical and has a core,
the inner volume is an annular space between the cylindrical substrate and the cylindrical outer transparent casing, and
all or a portion of the core of the cylindrical substrate is hollowed to form the first container;
the at least one solar cell is circumferentially disposed on the substrate;
the filler layer occupies the annular inner volume;
the diaphragm is affixed to the opening of the first container; and
the diaphragm is configured to:
decrease the container volume when the filler layer is in a thermally expanded state, and
increase the container volume when the filler layer is in a thermally contracted state.

Embodiment 12

The photovoltaic device of any one of embodiments 1-3, wherein
the outer transparent casing is sealed;
the filler layer is disposed within the sealed outer transparent casing and the filler composition expands in volume when the temperature of the photovoltaic device increases and contracts in volume when the temperature of the photovoltaic device decreases;

the substrate comprises a first lateral end and a second lateral end, wherein the substrate is hollowed to form the first container;

the diaphragm is associated with and substantially sealing an opening at the first lateral end of the substrate;

the filler layer substantially encapsulates the substrate and the at least one solar cell;

the container volume decreases in volume when the filler composition expands; and the container volume increases in volume when the filler composition contracts.

Embodiment 13

The photovoltaic device of any one of embodiments 1-3, wherein the substrate is tubular and comprises an exterior surface and wherein the at least one solar cell is disposed upon the exterior surface.

Embodiment 14

The photovoltaic device of any one of embodiments 1-3, wherein the substrate has a hollow core and the first container is formed in the hollow core.

Embodiment 15

The photovoltaic device of any one of embodiments 1-3, wherein the substrate is cylindrical.

Embodiment 16

The photovoltaic device of any one of embodiments 1-3, wherein the substrate is characterized by a cross-section that is circular, elliptical, a polygon, or a shape that has at least one arcuate edge.

Embodiment 17

The photovoltaic device of any one of embodiments 1-3, wherein the substrate is cylindrical and the first container is immersed in the filler layer between a solar cell in the at least one solar cell and the outer transparent casing.

Embodiment 18

The photovoltaic device of any one of embodiment 1-3, wherein the outer transparent casing is tubular and encapsulates the substrate.

Embodiment 19

The photovoltaic device of embodiment 18, wherein the substrate has a hollow core and the first container is formed in the hollow core.

Embodiment 20

The photovoltaic device of any one of embodiments 1-19, wherein the diaphragm is configured to decrease the container volume by up to 30 percent during an operating state of the photovoltaic device relative to a non-operating state of the photovoltaic device.

Embodiment 21

The photovoltaic device of any one of embodiments 1-20, wherein the filler composition has a volumetric thermal coefficient of expansion of greater than $250 \times 10^{-6}/°$ C.

Embodiment 22

The photovoltaic device of any one of embodiments 1-21, wherein a solar cell in the at least one solar cell comprises:
a conducting material disposed on the substrate;
a semiconductor junction disposed on said conducting material; and
a transparent conducting layer disposed on said semiconductor junction.

Embodiment 23

The photovoltaic device of embodiment 22, wherein the semiconductor junction comprises a heterojunction.

Embodiment 24

The photovoltaic device of embodiment 22, wherein the semiconductor junction comprises a homojunction, a heterojunction, a heteroface junction, a buried homojunction, a p-i-n junction, or a tandem junction.

Embodiment 25

The photovoltaic device of any one of embodiments 22-24, wherein said semiconductor junction comprises an absorber layer and a junction partner layer, wherein said junction partner layer is disposed on said absorber layer.

Embodiment 26

The photovoltaic device of embodiment 25, wherein said absorber layer is copper-indium-gallium-diselenide and said junction partner layer is $In_2Se_3$, $In_2S_3$, ZnS, ZnSe, CdInS, CdZnS, $ZnIn_2Se_4$, $ZnIn_2Mg_xO$, CdS, $SnO_2$, ZnO, $ZrO_2$, or doped ZnO.

Embodiment 27

The photovoltaic device of any one of embodiments 1-26, further comprising an antireflective coating disposed on the outer transparent casing.

Embodiment 28

The photovoltaic device of any one of embodiments 1-27, wherein the substrate comprises plastic or glass.

Embodiment 29

The photovoltaic device of any one of embodiments 1-28, wherein the substrate comprises metal or metal alloy.

Embodiment 30

The photovoltaic device of any one of embodiments 1-3, further comprising an additional one or more containers, wherein
each respective container in the additional one or more containers is within the inner volume, each respective container in the additional one or more containers is defined by at least one wall and an opening that opens to the filler layer; and a diaphragm is affixed to each opening of each respective container in the additional one or more containers.

Embodiment 31

The photovoltaic device of any one of embodiments 1-3, wherein the diaphragm comprises:
a concave extension that fits into the first container; and
a head that fits around a perimeter of the opening.

Embodiment 32

The photovoltaic device of any one of embodiments 1-3, wherein
the diaphragm comprises a plug;
the diaphragm is inserted into the first container under conditions of low filler layer pressure; and
the diaphragm expands and adopts a position in the interior of the container under conditions of high filler layer pressure.

Embodiment 33

The photovoltaic device of any one of embodiments 1-3, wherein
a head of the diaphragm comprises an expandable or resilient ring;
the ring is compressed to fit into the opening of the first container thereby expanding and creating a force against the at least one wall of the first container and sealing the opening.

Embodiment 34

The photovoltaic device of any one of embodiments 1-3, wherein the diaphragm has a lip and wherein the lip is dimensioned so that it cannot be pressed completely through the opening and into the first container.

Embodiment 35

The photovoltaic device of any one of embodiments 1-34, wherein the diaphragm is a made of plastic, rubber, a rubber derivative, silicone rubber, or an elastomer.

Embodiment 36

The photovoltaic device of any one of embodiments 1-35, wherein the at least one solar cell comprises a plurality of solar cells that are monolithically integrated onto the substrate and wherein (i) a first solar cell in the plurality of solar cells is electrically connected in series to a second solar cell in the plurality of solar cells or (ii) a first solar cell in the plurality of solar cells is electrically connected in parallel to a second solar cell in the plurality of solar cells.

Embodiment 37

The photovoltaic device of any one of embodiments 1-36, wherein the diaphragm is concave with respect to a plane of the opening.

Embodiment 38

The photovoltaic device of any one of embodiments 1-37, wherein the substrate or the transparent casing is rigid.

Embodiment 39

The photovoltaic device of any one of embodiments 1-38, wherein the substrate or the transparent casing is made of a linear material.

Embodiment 40

The photovoltaic device of any one of embodiments 1-39, wherein the substrate or the transparent casing has a Young's modulus of 40 GPa or greater.

REFERENCES CITED AND CONCLUSION

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed:

1. A photovoltaic device comprising:
 a) a sealed outer transparent casing defining an inner volume;
 b) a substrate disposed within the inner volume;
 c) at least one solar cell disposed on the substrate within the inner volume;
 d) a filler that occupies a space between the substrate and the transparent casing in the inner volume thereby sealing the at least one solar cell, wherein the filler comprises a filler composition, wherein the filler is in direct contact with the at least one solar cell;
 e) a first container within the inner volume, the first container defined by at least one wall and an opening, wherein the opening opens to the filler; and
 f) a diaphragm sealing the first container from the filler and making the first container airtight thereby defining a container volume within the container.

2. The photovoltaic device of claim 1, wherein the container volume does not contain the filler composition.

3. The photovoltaic device of claim 1, wherein at least a portion of the container volume does not contain the filler composition.

4. The photovoltaic device of claim 1, the photovoltaic device further comprising a plurality of containers within the inner volume, the plurality of containers including the first container, and wherein
 each container in the plurality of containers is defined by at least one wall and an opening;
 the opening of each container in the plurality of containers opens to the filler; and each respective container in the plurality of containers comprises a diaphragm sealing the respective container from the filler thereby defining a respective container volume within the container.

5. The photovoltaic device of claim 1, wherein the diaphragm is affixed to the opening and seals the opening from the filler, and wherein the diaphragm is configured to
 decrease the container volume when the filler thermally expands; and
 increase the container volume when the filler thermally contracts.

6. The photovoltaic device of claim 1, wherein
the diaphragm comprises a plug;
the diaphragm is inserted into the first container through the opening under conditions of low filler pressure; and
the diaphragm expands and adopts a position in the interior of the first container under conditions of high filler pressure.

7. The photovoltaic device of claim 1, wherein
the diaphragm comprises a plug;
the diaphragm is inserted into the first container through the opening under conditions of low filler temperature; and
the diaphragm expands and adopts a position in the interior of the first container under conditions of high filler temperature.

8. The photovoltaic device of claim 1, wherein the diaphragm includes a head that comprises an expandable or resilient ring that is compressed to fit into the opening of the first container thereby expanding and creating a force against the at least one wall of the first container and sealing the opening and wherein the diaphragm is configured to:
decrease the container volume when the filler thermally expands, and
increase the container volume when the filler thermally contracts.

9. The photovoltaic device of claim 1, wherein
the diaphragm is affixed to the opening of the first container;
the diaphragm comprises a lip that is dimensioned so that it cannot be pressed completely through the opening and into the first container; and
the diaphragm is configured to:
decrease the container volume when the filler thermally expands, and
increase the container volume when the filler thermally contracts.

10. The photovoltaic device of claim 1, wherein
the opening is in fluid communication with the filler;
the diaphragm is affixed to the opening of the first container;
the diaphragm is concave with respect to a plane of the opening; and
the diaphragm is configured to:
decrease the container volume when the filler thermally expands, and
increase the container volume when the filler thermally contracts.

11. The photovoltaic device of claim 1, wherein
the outer transparent casing is cylindrical;
the substrate is cylindrical and has a core,
the inner volume is an annular space between the cylindrical substrate and the cylindrical outer transparent casing, and
all or a portion of the core of the cylindrical substrate is hollowed to form the first container;
the at least one solar cell is circumferentially disposed on the substrate;
the filler occupies the annular inner volume;
the diaphragm is affixed to the opening of the first container; and
the diaphragm is configured to:
decrease the container volume when the filler is in a thermally expanded state, and
increase the container volume when the filler is in a thermally contracted state.

12. The photovoltaic device of claim 1, wherein
the outer transparent casing is sealed;
the filler is disposed within the sealed outer transparent casing and the filler composition expands in volume when the temperature of the photovoltaic device increases and contracts in volume when the temperature of the photovoltaic device decreases;
the substrate comprises a first lateral end and a second lateral end, wherein the substrate is hollowed to form the first container;
the diaphragm is associated with and substantially sealing an opening at the first lateral end of the substrate;
the filler substantially encapsulates the substrate and the at least one solar cell;
the container volume decreases in volume when the filler composition expands; and
the container volume increases in volume when the filler composition contracts.

13. The photovoltaic device of claim 1, wherein the substrate is tubular and comprises an exterior surface and wherein the at least one solar cell is disposed upon the exterior surface.

14. The photovoltaic device of claim 1, wherein the substrate has a hollow core and the first container is formed in the hollow core.

15. The photovoltaic device of claim 1, wherein the substrate is cylindrical.

16. The photovoltaic device of claim 1, wherein the substrate is characterized by a cross-section having a bounding shape, wherein the bounding shape is circular, elliptical, a polygon, ovoid, or wherein the bounding shape is characterized by one or more smooth curved surfaces, or one or more arcuate edges.

17. The photovoltaic device of claim 1, wherein the substrate is cylindrical and the first container is immersed in the filler between a solar cell in the at least one solar cell and the outer transparent casing.

18. The photovoltaic device of claim 1, wherein the outer transparent casing is tubular and encapsulates the substrate.

19. The photovoltaic device of claim 18, wherein the substrate has a hollow core and the first container is formed in the hollow core.

20. The photovoltaic device of claim 1, wherein the diaphragm is configured to decrease the container volume by up to 30 percent during an operating state of the photovoltaic device relative to a non-operating state of the photovoltaic device.

21. The photovoltaic device of claim 1, wherein the filler composition has a volumetric thermal coefficient of expansion of greater than $250 \times 10^{-6}/^\circ C$.

22. The photovoltaic device of claim 1, wherein a solar cell in the at least one solar cell comprises:
a conducting material disposed on the substrate;
a semiconductor junction disposed on said conducting material; and
a transparent conducting layer disposed on said semiconductor junction.

23. The photovoltaic device of claim 22, wherein the semiconductor junction comprises a heterojunction.

24. The photovoltaic device of claim 22, wherein the semiconductor junction comprises a homojunction, a heterojunction, a heteroface junction, a buried homojunction, a p-i-n junction, or a tandem junction.

25. The photovoltaic device of claim 22, wherein said semiconductor junction comprises an absorber layer and a junction partner layer, wherein said junction partner layer is disposed on said absorber layer.

26. The photovoltaic device of claim 25, wherein said absorber layer is copper-indium-gallium-diselenide and said junction partner layer is $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$, or doped ZnO.

27. The photovoltaic device of claim 1, further comprising an antireflective coating disposed on the outer transparent casing.

28. The photovoltaic device of claim 1, wherein the substrate comprises plastic or glass.

29. The photovoltaic device of claim 1, wherein the substrate comprises metal or metal alloy.

30. The photovoltaic device of claim 1, further comprising an additional one or more containers, wherein
   each respective container in the additional one or more containers is within the inner volume,
   each respective container in the additional one or more containers is defined by at least one wall and an opening that opens to the filler; and
   a diaphragm is affixed to each opening of each respective container in the additional one or more containers.

31. The photovoltaic device of claim 1, wherein the diaphragm comprises:
   a concave extension that fits into the first container; and
   a head that fits around a perimeter of the opening.

32. The photovoltaic device of claim 1, wherein
   the diaphragm comprises a plug;
   the diaphragm is inserted into the first container under conditions of low filler pressure; and
   the diaphragm expands and adopts a position in the interior of the container under conditions of high filler pressure.

33. The photovoltaic device of claim 1, wherein
   a head of the diaphragm comprises an expandable or resilient ring;
   the ring is compressed to fit into the opening of the first container thereby expanding and creating a force against the at least one wall of the first container and sealing the opening.

34. The photovoltaic device of claim 1, wherein the diaphragm has a lip and wherein the lip is dimensioned so that it cannot be pressed completely through the opening and into the first container.

35. The photovoltaic device of claim 1, wherein the diaphragm is a made of plastic, rubber, a rubber derivative, silicone rubber, or an elastomer.

36. The photovoltaic device of claim 1, wherein the at least one solar cell comprises a plurality of solar cells that are monolithically integrated onto the substrate and wherein (i) a first solar cell in the plurality of solar cells is electrically connected in series to a second solar cell in the plurality of solar cells or (ii) a first solar cell in the plurality of solar cells is electrically connected in parallel to a second solar cell in the plurality of solar cells.

37. The photovoltaic device of claim 1, wherein the diaphragm is concave with respect to a plane of the opening.

38. The photovoltaic device of claim 1, wherein the substrate or the transparent casing is rigid.

39. The photovoltaic device of claim 1, wherein the substrate or the transparent casing is made of a linear material.

40. The photovoltaic device of claim 1, wherein the substrate or the transparent casing has a Young's modulus of 40 GPa or greater.

41. The photovoltaic device of claim 1, wherein the first container is under less than 500 Torr of pressure.

42. The photovoltaic device of claim 1, wherein the first container contains an inert gas.

43. The photovoltaic device of claim 1, wherein the substrate is planar.

44. The photovoltaic device of claim 1, wherein the at least one solar cell is circumferentially disposed on the substrate.

45. The photovoltaic device of claim 1, wherein the photovoltaic device is elongated.

* * * * *